US011404138B2

(12) United States Patent
Lakshminarayana Addagalla et al.

(10) Patent No.: US 11,404,138 B2
(45) Date of Patent: Aug. 2, 2022

(54) NON-VOLATILE MEMORY ARRAY LEAKAGE DETECTION

(71) Applicant: SanDisk Technologies LLC, Addison, TX (US)

(72) Inventors: Aswani Krishna Lakshminarayana Addagalla, Bangalore (IN); Sridhar Yadala, Bengaluru (IN); Pradeep Anantula, Bangalore (IN); Sivakumar Grandhi, Bangalore (IN); V.S.N.K.Chaitanya G, Bangalore (IN)

(73) Assignee: SanDisk Technologies LLC, Addison, TX (US)

( * ) Notice: Subject to any disclaimer, the term of this patent is extended or adjusted under 35 U.S.C. 154(b) by 117 days.

(21) Appl. No.: 16/905,689

(22) Filed: Jun. 18, 2020

(65) Prior Publication Data
US 2021/0398602 A1   Dec. 23, 2021

(51) Int. Cl.
*G11C 29/44*   (2006.01)
*G11C 16/04*   (2006.01)
*G11C 16/08*   (2006.01)
*G11C 29/12*   (2006.01)
*G11C 5/14*    (2006.01)
(Continued)

(52) U.S. Cl.
CPC .......... *G11C 29/44* (2013.01); *G11C 16/0483* (2013.01); *G11C 16/08* (2013.01); *G01R 19/16528* (2013.01); *G01R 19/25* (2013.01); *G01R 19/2509* (2013.01); *G01R 31/3842* (2019.01); *G01R 31/52* (2020.01); *G11C 5/063* (2013.01); *G11C 5/145* (2013.01); *G11C 5/147* (2013.01); *G11C 13/0028* (2013.01);
(Continued)

(58) Field of Classification Search
CPC ............... G01R 31/52; G01R 19/165; G01R 19/16528; G01R 19/25; G01R 19/2509; G01R 31/3842; G11C 13/0028; G11C 2029/5006; G11C 5/147; G11C 2029/1202; G11C 29/50; G11C 5/063; G11C 29/44; G11C 16/0483; G11C 16/08
See application file for complete search history.

(56) References Cited

U.S. PATENT DOCUMENTS 5,351,214 A    9/1994  Rouy
6,661,720 B2  12/2003  Chevallier
(Continued)

*Primary Examiner* — April Y Blair
*Assistant Examiner* — Sazzad Hossain
(74) *Attorney, Agent, or Firm* — Vierra Magen Marcus LLP

(57) ABSTRACT

An apparatus and method for detecting leakage current in a non-volatile memory array. A reference current is connected to a leakage detection circuit. A reference code is determined for the leakage detection circuit coupled to a switching circuit. The reference code establishes a leakage current threshold. The reference current is disconnected from the leakage detection circuit and the switching circuit. Next, the leakage detection circuit is connected to a set of word lines of a storage block of a non-volatile memory array by way of the switching circuit. A memory current is generated within the set of word lines. A leakage code is determined for the set of word lines representing leakage current from the word lines in response to the memory current. The leakage code is compared with the reference code. If the leakage code exceeds the reference code, the storage block is deemed unusable.

20 Claims, 14 Drawing Sheets

(51) Int. Cl.
  *G11C 29/50*      (2006.01)
  *G01R 31/52*      (2020.01)
  *G01R 31/3842*    (2019.01)
  *G11C 13/00*      (2006.01)
  *G01R 19/25*      (2006.01)
  *G01R 19/165*     (2006.01)
  *G11C 5/06*       (2006.01)

(52) U.S. Cl.
  CPC ...... *G11C 29/50* (2013.01); *G11C 2029/1202* (2013.01); *G11C 2029/5006* (2013.01)

(56) References Cited

U.S. PATENT DOCUMENTS

| | | |
|---|---|---|
| 8,514,630 B2 | 8/2013 | Huynh et al. |
| 9,164,526 B2 | 10/2015 | Pan et al. |
| 9,443,610 B1 | 9/2016 | Pan et al. |
| 9,460,786 B2 | 10/2016 | Kang |
| 9,698,676 B1 | 7/2017 | Huynh et al. |
| 10,008,276 B2 | 6/2018 | Huynh et al. |
| 2010/0125429 A1* | 5/2010 | Yamada ................ G11C 7/1006 702/64 |
| 2016/0018454 A1* | 1/2016 | Jeon ................ G11C 29/12005 324/509 |
| 2018/0183458 A1* | 6/2018 | Lee ..................... H03M 1/462 |
| 2019/0320127 A1* | 10/2019 | Buckler ................ H04N 5/343 |
| 2020/0041567 A1* | 2/2020 | Armstrong ........... G01R 31/086 |

* cited by examiner

NON-VOLATILE MEMORY ARRAY LEAKAGE DETECTION

BACKGROUND

Storage blocks (e.g., physical erase blocks) may experience leakage current along the word lines that make up those storage blocks. Storage blocks exhibiting leakage current above an acceptable threshold may not be reliably used. Newly manufactured memory dies will be tested before inclusion in storage devices to determine which, if any, storage blocks exceed the acceptable leakage current threshold, and those storage blocks may be marked as "bad blocks" and will not be used for storage operations in the assembled device.

Leakage current testing may be performed at various stages of the manufacturing process, such as at die sort, known good die determination, and back end test points. However, because storage blocks of memory undergo this testing, and because of the time needed to complete conventional leakage current tests, word line leakage tests consume a significant amount of time and add to testing costs. Conventional leakage current tests may consume 9% of total test time. As die capacity increases, both the number of storage blocks and the number of word lines may increase, further adding to the significant testing time needed. Therefore, a faster word line leakage detection test solution is needed. Furthermore, a word line leakage detection test that can be performed without a tester would be advantageous.

BRIEF SUMMARY

This disclosure relates to a method for detecting leakage current in a non-volatile memory array. A reference current is connected to a leakage detection circuit. A reference code is determined for the leakage detection circuit coupled to a switching circuit. The reference code establishes a leakage current threshold. The reference current is then disconnected from the leakage detection circuit and the switching circuit. Next, the leakage detection circuit is connected to a set of word lines of a storage block of a non-volatile memory array by way of the switching circuit. A memory current is generated within the set of word lines. A leakage code is determined for the set of word lines representing leakage current from the word lines in response to the memory current. The leakage code is compared with the reference code. If the leakage code exceeds the reference code, the storage block is deemed unusable.

This disclosure further relates to a memory die comprising a driver circuit, a leakage detection circuit, and a die controller. The driver circuit supplies a word line voltage to a set of word lines of a non-volatile memory array in order to detect leakage current from that set of word lines. The leakage detection circuit includes a current control circuit, a resistor, and a successive approximation analog to digital conversion circuit (SAR ADC circuit). The current control circuit supplies current for detecting the leakage current within the set of word lines. The current mirror circuit is coupled to the word line voltage from the driver circuit and further coupled to the current control circuit. The current mirror circuit mirrors the reference current supplied by the current control circuit and the memory current from the set of word lines. The resistor is connected in series between the current mirror circuit and a SAR ADC circuit. The resistor transforms one of the reference current and the memory current into a leakage detection voltage. The SAR ADC circuit receives the leakage detection voltage and generates a digital output code based on the leakage detection voltage. The digital output code comprises one of a reference code and a leakage code. The die controller directs the leakage detection circuit to determine the reference code that comprises a leakage current threshold. The die controller then directs the leakage detection circuit to determine the leakage code comprising a leakage current from the set of word lines. The die controller compares the reference code and the leakage code. If the leakage code exceeds the reference code, the die controller determines that the set of word lines have unacceptable leakage current.

Finally, this disclosure relates to an apparatus comprising a non-volatile memory array, a driver circuit, a leakage detection circuit, and a die controller. The non-volatile memory array comprises two planes. Each plane is organized into a plurality of physical erase blocks, and each physical erase block comprises word lines having memory cells coupled to NAND strings coupled to bit lines. The driver circuit supplies a word line programming voltage to selected word lines within each of the plurality of physical erase blocks. The leakage detection circuit comprises a current control circuit, a current mirror circuit, and a source transformer. The current control circuit supplies current for detecting leakage current within the word lines. The current mirror circuit is coupled to the programming voltage from the driver circuit and is further coupled to the current control circuit.

The current mirror circuit mirrors one of a reference current supplied by the current control circuit and a memory current from the selected word lines. Said another way, output current on an output side of a current mirror circuit mirrors or matches current present on a reference side of the current mirror circuit. The source transformer transforms the reference current and memory current into a leakage detection voltage. The leakage detection circuit provides as its output a nine-bit digital output code within nine clock cycles. The digital output code is a reference code or a leakage code. The die controller directs the leakage detection circuit to determine a reference code comprising a leakage current threshold. The die controller may further direct the leakage detection circuit to determine an even leakage code that comprises a leakage current from even selected word lines. The die controller may then compare the reference code and the even leakage code and determine that the even selected word lines have unacceptable leakage current in response to the even leakage code exceeding the reference code. The die controller may further direct the leakage detection circuit to determine an odd leakage code that comprises a leakage current from odd selected word lines. The die controller may then compare the reference code and the odd leakage code and determine that the odd selected word lines have unacceptable leakage current in response to the odd leakage code exceeding the reference code.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
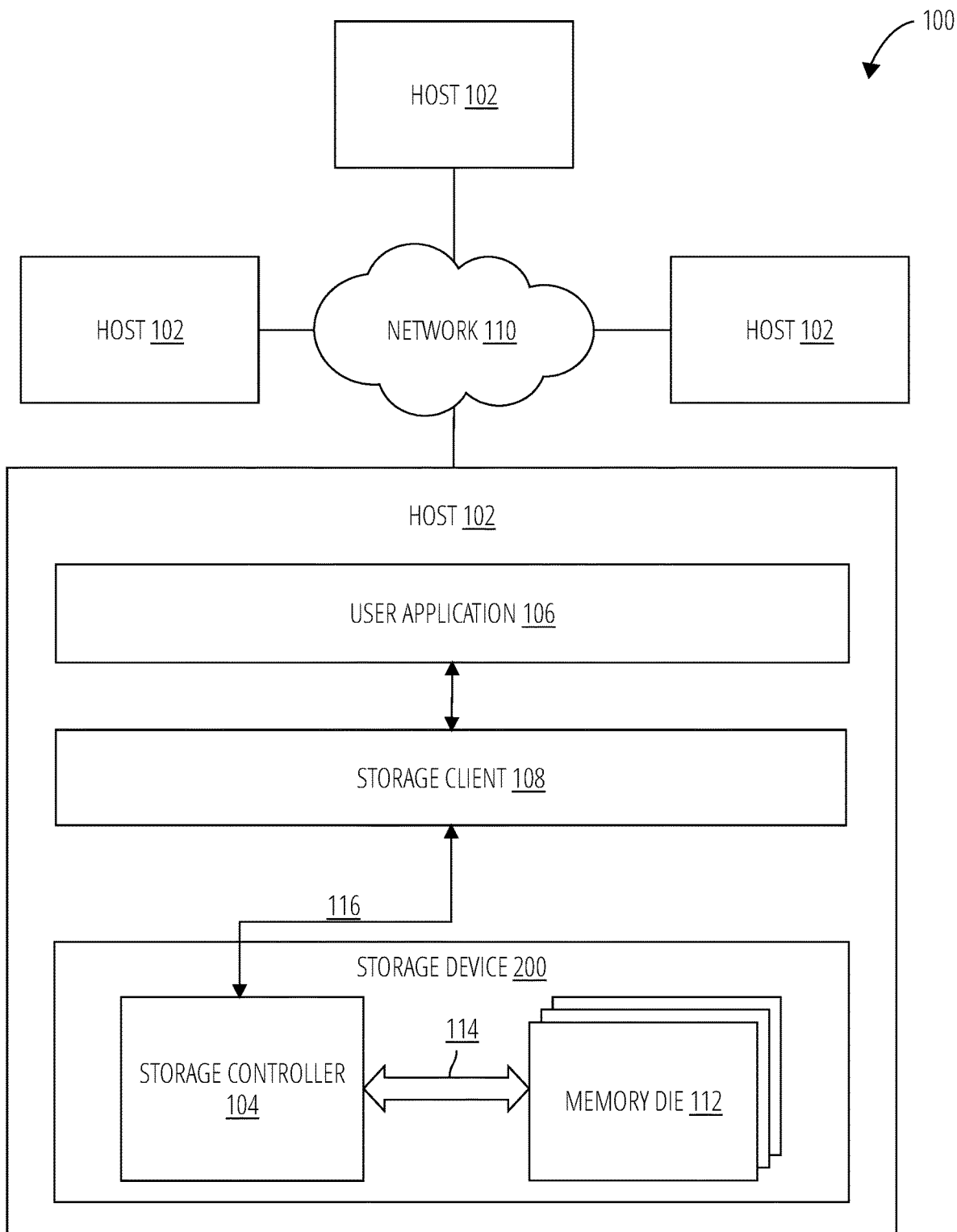
FIG. 1 illustrates a storage system 100 in accordance with one embodiment.

This disclosure relates to a memory device and method of use that allow significantly faster leakage current testing of memory devices. "Leakage current" refers to electrical current that escapes from a control line due to a defect, short, or other anomaly between the control line and another conducting structure.

A leakage detection circuit may be implemented on a memory die that facilitates significantly faster leakage current testing when compared with conventional solutions. The disclosed solution uses a resistor to convert leakage current into a leakage detection voltage, which may then be digitalized for more rapid handling. "Leakage detection voltage" refers to a voltage designed, engineered, and/or configured to represent a level of leakage current within, or from, one or more target control lines that are tested or checked for leakage current. A successive approximation method utilizing a binary search technique may be used to develop a digitalized value for comparison with a reference or threshold value previously determined for each storage block.

A previous method of detecting leakage current involves providing a high programming voltage (VPGM) through a current mirror. "Programming voltage" refers to a voltage level configured change a characteristic of a memory cell from a first state (often, an erased state) to a second state. A program voltage may also be referred to as a write voltage.

In certain embodiments, the memory cells may comprise transistors and the programming voltage is a voltage level at, or above which, a threshold voltage for the memory cell changes to a new level. The voltage is first applied with one side of the mirror connected to a reference load circuit to generate a reference output, which is digitalized and stored in a register. The current mirror may then be connected to the storage block under test. A linear search algorithm may then be used to measure the leakage current for comparison with the reference value previously stored. The time needed to complete the linear search algorithm may be based on a cycle time of 640 ns needed to evaluate each potential value of the digitalized leakage detection voltage. For a nine-bit leakage code, a total detection time that may be needed may be $2^9 \times 640$ ns, or a total of 327.68 µS. "Leakage code" refers to a digital output code configured and/or encoded to represent a magnitude of current leakage on an electrical line or control line.

Using a mirror circuit with successive approximation and a binary search method, as disclosed herein, to obtain a nine-bit digitalized measurement for leakage detection voltage may require no more than nine clock periods, one for each bit. A typical clock period for this conversion may be 240 ns, giving a total time to develop the digital output code of 9×240 ns or 2.16 µs from a settled voltage reading. "Digital output code" refers to a binary code made up of one or more binary bits, each bit configured to have a set value ("1") or an unset/reset value ("0"). If the expected settling time for the voltage used to generate this code is 5 µs, the greatest time needed to generate a detection value may be 7.16 µs.

Assuming a one-terabyte memory array, 3,310 separate storage blocks may need to undergo leakage current testing. The total time needed to test such an array may be 2×leakage test duration×3,310 storage blocks. The previous testing method employing a current mirror with linear search may use a total test time of 2169.24 milliseconds. A clock counting method may use a total time of 8606 milliseconds. In comparison, in one embodiment, the claimed solution, employing a current mirror with successive approximation and binary search, may take just 47.4 milliseconds to complete. Thus, the disclosed solution may reduce leakage current testing to between 0.5% and 2.1% of the time taken using prior solutions. The device or apparatus and method used to accomplish this are described in detail below.

FIG. 1 is a schematic block diagram illustrating one embodiment of a storage system 100 that includes a storage device in accordance with the disclosed solution. The storage system 100 comprises a storage device 200, a storage controller 104, a memory die 112, at least one host 102, a user application 106, a storage client 108, a data bus 116, a bus 114, and a network 110. "Host" refers to any computing device or computer device or computer system configured to send and receive storage commands. Examples of a host include, but are not limited to, a computer, a laptop, a mobile device, an appliance, a virtual machine, an enterprise server, a desktop, a tablet, a main frame, and the like.

"Storage command" refers to any command relating with a storage operation. Examples of storage commands include, but are not limited to, read commands, write commands, maintenance commands, configuration command, administration command, diagnostic commands, test mode commands, countermeasure command, and any other command a storage controller may receive from a host or issue to another component, device, or system.

"Write command" refers to a storage command configured to direct the recipient to write, or store, one or more data blocks on a persistent storage media, such as a hard disk drive, non-volatile memory media, or the like. A write command may include any storage command that may result in data being written to physical storage media of a storage device. The write command may include enough data to fill one or more data blocks, or the write command may include enough data to fill a portion of one or more data blocks. In one embodiment, a write command includes a starting logical block address (LBA) and a count indicating the number of LBAs of data to write to on the storage media.

"Logical block address" or "LBA" refers to a value used in a block storage device to associate each of n logical blocks available for user data storage across the storage media with an address. In certain block storage devices, the LBAs may range from 0 to n per volume or partition. In block storage devices, each LBA maps directly to a particular data block, and each data block maps to a particular set of physical sectors on the physical storage media. "User data" refers to data that a host directs a non-volatile storage device to store or record.

"Data block" refers to a smallest physical amount of storage space on physical storage media that is accessible, and/or addressable, using a storage command. The physical storage media may be volatile memory media, non-volatile memory media, persistent storage, non-volatile storage, flash storage media, hard disk drive, or the like. Certain conventional storage devices divide the physical storage media into volumes or logical partitions (also referred to as partitions). Each volume or logical partition may include a plurality of sectors. One or more sectors are organized into a block (also referred to as a data block). In certain storage systems, such as those interfacing with the Windows® operating systems, the data blocks are referred to as clusters. In other storage systems, such as those interfacing with UNIX, Linux, or similar operating systems, the data blocks are referred to simply as blocks. A data block or cluster represents a smallest physical amount of storage space on the storage media that is managed by a storage controller. A block storage device may associate n data blocks available for user data storage across the physical storage media with an LBA, numbered from 0 to n. In certain block storage devices, the LBAs may range from 0 to n per volume or logical partition. In conventional block storage devices, a logical block address maps directly to one and only one data block.

The storage system 100 includes at least one storage device 200, comprising a storage controller 104 and one or more memory dies 112, connected by a bus 114. "Storage controller" refers to any hardware, device, component, element, or circuit configured to manage data operations on non-volatile memory media, and may comprise one or more processors, programmable processors (e.g., FPGAs), ASICs, micro-controllers, or the like. In some embodiments, the storage controller is configured to store data on and/or read data from non-volatile memory media, to transfer data to/from the non-volatile memory device(s), and so on.

"Memory die" refers to a small piece of semiconducting material on which a given functional circuit is fabricated. Typically, integrated circuits are produced in large batches on a single wafer of electronic-grade silicon (EGS) or other semiconductor (such as GaAs) through processes such as photolithography. The wafer is cut (diced) into many pieces, each containing one copy of the circuit. Each of these pieces is called a die or memory die. (Search 'die (integrated circuit)' on Wikipedia.com Oct. 9, 2019. Accessed Nov. 18, 2019.)

A memory die is a die, in one embodiment, that includes one or more functional circuits for operating as a non-volatile memory media and/or a non-volatile memory array. "Non-volatile memory array" refers to a set of non-volatile storage cells (also referred to as memory cells or non-volatile memory cells) organized into an array structure having rows and columns. A memory array is addressable using a row identifier and a column identifier.

"Memory cell" refers to a type of storage media configured to represent one or more binary values by way of a determinable physical characteristic of the storage media when the storage media is sensed, read, or detected to determine what binary value(s) was last stored in the memory cell. Memory cell and storage cell are used interchangeably herein.

"Storage cell" refers to a type of storage media configured to represent one or more binary values by way of a determinable characteristic of the storage media when the storage media is sensed, read, or detected to determine a binary value(s) stored, or represented by, the determinable characteristic of the memory cell. Storage cell and memory cell are used interchangeably herein.

The type of determinable characteristic used to store data in a memory cell may vary depending on the type of memory or storage technology used. For example, in flash memory cells in which each memory cell comprises a transistor having a source lead, a drain lead and a gate, the determinable characteristic is a voltage level that when applied to the gate causes the memory cell to conduct a current between the drain and the source leads. The voltage level, in this example, is referred to herein as a threshold voltage. A threshold voltage may also be referred to as a control gate reference voltage (CGRV), read voltage, or reference voltage.

Examples of the determinable physical characteristic include, but are not limited to, a threshold voltage for a transistor, an electrical resistance level of a memory cell, a current level through a memory cell, a magnetic pole orientation, a spin-transfer torque, and the like.

"Non-volatile memory media" refers to any hardware, device, component, element, or circuit configured to maintain an alterable physical characteristic used to represent a binary value of zero or one after a primary power source is removed. Examples of the alterable physical characteristic include, but are not limited to, a threshold voltage for a transistor, an electrical resistance level of a memory cell, a current level through a memory cell, a magnetic pole orientation, a spin-transfer torque, and the like.

The alterable physical characteristic is such that, once set, the physical characteristic stays sufficiently fixed such that when a primary power source for the non-volatile memory media is unavailable the alterable physical characteristic can be measured, detected, or sensed, when the binary value is read, retrieved, or sensed. Said another way, non-volatile memory media is a storage media configured such that data stored on the non-volatile memory media is retrievable after a power source for the non-volatile memory media is removed and then restored. Non-volatile memory media may comprise one or more non-volatile memory elements, which may include, but are not limited to: chips, packages, planes, memory die, and the like. "Plane" refers to a division of the memory array that permits certain storage operations to be performed on both planes using certain physical row addresses and certain physical column addresses.

Examples of non-volatile memory media include but are not limited to: ReRAM, Memristor memory, programmable metallization cell memory, phase-change memory (PCM, PCME, PRAM, PCRAM, ovonic unified memory, chalcogenide RAM, or C-RAM), NAND FLASH memory (e.g., 2D NAND FLASH memory, 3D NAND FLASH memory), NOR FLASH memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like.

While the non-volatile memory media is referred to herein as "memory media," in various embodiments, the non-volatile memory media may more generally be referred to as non-volatile memory. Because non-volatile memory media is capable of storing data when a power supply is removed, the non-volatile memory media may also be referred to as a recording media, non-volatile recording media, non-volatile storage media, storage, non-volatile memory, non-volatile memory medium, non-volatile storage medium, non-volatile storage, or the like. "Non-volatile storage media" refers to any hardware, device, component, element, or circuit configured to maintain an alterable physical characteristic used to represent a binary value of zero or one after a primary power source is removed. Non-volatile storage media may be used interchangeably herein with the term non-volatile memory media.

In certain embodiments, data stored in non-volatile memory media is addressable at a block level which means that the data in the non-volatile memory media is organized into data blocks that each have a unique logical address (e.g., LBA). In other embodiments, data stored in non-volatile memory media is addressable at a byte level which means that the data in the non-volatile memory media is organized into bytes (8 bits) of data that each have a unique address, such as a logical address. One example of byte addressable non-volatile memory media is storage class memory (SCM).

In some embodiments, each storage device 200 may include two or more memory dies 112, such as flash memory, nano random-access memory ("nano RAM or NRAM"), magneto-resistive RAM ("MRAM"), dynamic RAM ("DRAM"), phase change RAM ("PRAM"), etc. In further embodiments, the data storage device 200 may include other types of non-volatile and/or volatile data storage, such as dynamic RAM ("DRAM"), static RAM ("SRAM"), magnetic data storage, optical data storage, and/or other data storage technologies.

The storage device 200 may be a component within a host 102 as depicted in here, and may be connected using a data bus 116, such as a peripheral component interconnect express ("PCI-e") bus, a Serial Advanced Technology Attachment ("serial ATA") bus, or the like. In another embodiment, the storage device 200 is external to the host 102 and is connected, a universal serial bus ("USB") connection, an Institute of Electrical and Electronics Engineers ("IEEE") 1394 bus ("FireWire"), or the like. In other embodiments, the storage device 200 is connected to the host 102 using a peripheral component interconnect ("PCI") express bus using external electrical or optical bus extension or bus networking solution such as InfiniBand or PCI Express Advanced Switching ("PCIe-AS"), or the like.

In various embodiments, the storage device 200 may be in the form of a dual-inline memory module ("DIMM"), a daughter card, or a micro-module. In another embodiment, the storage device 200 is a component within a rack-mounted blade. In another embodiment, the storage device 200 is contained within a package that is integrated directly onto a higher-level assembly (e.g., mother board, laptop, graphics processor). In another embodiment, individual components comprising the storage device 200 are integrated directly onto a higher-level assembly without intermediate packaging. The storage device 200 is described in further detail with regard to FIG. 2.

"Processor" refers to any circuitry, component, chip, die, package, or module configured to receive, interpret, decode, and execute machine instructions. Examples of a processor may include, but are not limited to, a central processing unit, a general-purpose processor, an application-specific processor, a graphics processing unit (GPU), a field programmable gate array (FPGA), Application Specific Integrated Circuit (ASIC), System on a Chip (SoC), virtual processor, processor core, and the like.

In a further embodiment, instead of being connected directly to the host 102 as DAS, the data storage device 200 may be connected to the host 102 over a data network. For example, the data storage device 200 may include a storage area network ("SAN") storage device, a network attached storage ("NAS") device, a network share, or the like. In one embodiment, the storage system 100 may include a data network, such as the Internet, a wide area network ("WAN"), a metropolitan area network ("MAN"), a local area network ("LAN"), a token ring, a wireless network, a fiber channel network, a SAN, a NAS, ESCON, or the like, or any combination of networks. A data network may also include a network from the IEEE 802 family of network technologies, such Ethernet, token ring, Wi-Fi, Wi-Max, and the like. A data network may include servers, switches, routers, cabling, radios, and other equipment used to facilitate networking between the host 102 and the data storage device 200.

The storage system 100 includes at least one host 102 connected to the storage device 200. Multiple hosts 102 may be used and may comprise a server, a storage controller of a storage area network ("SAN"), a workstation, a personal computer, a laptop computer, a handheld computer, a super-computer, a computer cluster, a network switch, router, or appliance, a database or storage appliance, a data acquisition or data capture system, a diagnostic system, a test system, a robot, a portable electronic device, a wireless device, or the like. In another embodiment, a host 102 may be a client, and the storage device 200 may operate autonomously to service data requests sent from the host 102. In this embodiment, the host 102 and storage device 200 may be connected using a computer network, system bus, Direct Attached Storage (DAS), or other communication means suitable for connection between a computer and an autonomous storage device 200.

The depicted embodiment shows a user application 106 in communication with a storage client 108 as part of the host 102. In one embodiment, the user application 106 is a software application operating on or in conjunction with the storage client 108. "Storage client" refers to any hardware, software, firmware, or logic component or module configured to communicate with a storage device in order to use storage services. Examples of a storage client include, but are not limited to, operating systems, file systems, database applications, a database management system ("DBMS"), server applications, a server, a volume manager, kernel-level processes, user-level processes, applications, mobile applications, threads, processes, and the like.

"Software" refers to logic implemented as processor-executable instructions in a machine memory (e.g., read/write volatile memory media or non-volatile memory media).

"Hardware" refers to functional elements embodied as analog and/or digital circuitry.

"Firmware" refers to logic embodied as processor-executable instructions stored on volatile memory media and/or non-volatile memory media.

The storage client 108 manages files and data and utilizes the functions and features of the storage controller 104 and associated memory dies 112. Representative examples of storage clients include, but are not limited to, a server, a file system, an operating system, a database management system ("DBMS"), a volume manager, and the like. The storage client 108 is in communication with the storage controller 104 within the storage device 200. In some embodiments, the storage client 108 may include remote storage clients operating on hosts 102 or otherwise accessible via the network 110. Storage clients may include, but are not limited to operating systems, file systems, database applications, server applications, kernel-level processes, user-level processes, applications, and the like.

In one embodiment, the storage system 100 includes one or more clients connected to one or more hosts 102 through one or more computer networks 110. A host 102 may be a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The network 110 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The network 110 may also include a network from the IEEE 802 family of network technologies, such Ethernet, token ring, WiFi, WiMax, and the like.

The network 110 may include servers, switches, routers, cabling, radios, and other equipment used to facilitate networking the host 102 or hosts 102 and clients. In one embodiment, the storage system 100 includes multiple hosts 102 that communicate as peers over a network 110. In another embodiment, the storage system 100 includes multiple storage devices 200 that communicate as peers over a network 110. One of skill in the art will recognize other computer networks comprising one or more computer networks and related equipment with single or redundant connection between one or more clients or other computer with one or more storage devices 200 connected to one or more hosts. In one embodiment, the storage system 100 includes two or more storage devices 200 connected through the network 110 to a remote host 102, without being directly connected to or integrated within a local host 102.

In one embodiment, the storage client 108 communicates with the storage controller 104 through a host interface comprising an Input/Output (I/O) interface. For example, the storage device 200 may support the ATA interface standard, the ATA Packet Interface ("ATAPI") standard, the small computer system interface ("SCSI") standard, and/or the Fibre Channel standard which are maintained by the Inter-National Committee for Information Technology Standards ("INCITS").

In certain embodiments, the storage media of a memory device is divided into volumes or partitions. Each volume or partition may include a plurality of sectors. Traditionally, a sector is 512 bytes of data. One or more sectors are organized into a block (referred to herein as both block and data block, interchangeably).

In one example embodiment, a data block includes eight sectors which is 4 KB. In certain storage systems, such as those interfacing with the Windows® operating systems, the data blocks are referred to as clusters. In other storage systems, such as those interfacing with UNIX, Linux, or similar operating systems, the data blocks are referred to simply as blocks. A block or data block or cluster represents a smallest physical amount of storage space on the storage media that is managed by a storage manager, such as a storage controller, storage system, storage unit, storage device, or the like.

In some embodiments, the storage controller 104 may be configured to store data on one or more asymmetric, write-once storage media, such as solid-state storage memory cells within the memory die 112. "Write once storage media" refers to a storage media such as a storage cell that is reinitialized (e.g., erased) before new data or a change to the data is written or programmed thereon. In other words, data of a write once storage media cannot be overwritten; the write once storage media must be erased before subsequently writing data to the write once storage media. "Asymmetric storage media" refers to a storage media having different latencies for different storage operations. Many types of solid-state storage media (e.g., memory dies) are asymmetric; for example, a read operation may be much faster than a write/program operation, and a write/program operation may be much faster than an erase operation (e.g., reading the storage media may be hundreds of times faster than erasing, and tens of times faster than programming the storage media).

"Program" refers to a storage operation in which a characteristic of a memory cell is changed from a first state (often, an erased state) to a second state. A program storage operation may also be referred to as a write operation herein.

In certain embodiments, a program storage operation may include a series of iterations that incrementally change the characteristic until at least a target level of change is achieved. In other embodiments, a program storage operation may cause the attribute to change to a target level with a single iteration.

The memory die 112 may be partitioned into memory divisions that can be erased as a group (e.g., erase blocks) in order to, inter alia, account for the asymmetric properties of the memory die 112 or the like. As such, modifying a single data segment in-place may involve erasing the entire erase block comprising the data, and rewriting the modified data to the erase block, along with the original, unchanged data. This may result in inefficient write amplification, which may excessively wear the memory die 112.

"Erase block" refers to a logical erase block or a physical erase block. In one embodiment, a physical erase block represents the smallest storage unit within a given memory die that can be erased at a given time (e.g., due to the wiring of storage cells on the memory die). In one embodiment, logical erase blocks represent the smallest storage unit, or storage block, erasable by a storage controller in response to receiving an erase command. In such an embodiment, when the storage controller receives an erase command specifying a particular logical erase block, the storage controller may erase each physical erase block within the logical erase block simultaneously. It is noted that physical erase blocks within a given logical erase block may be considered as contiguous within a physical address space even though they reside in separate dies. Thus, the term "contiguous" may be applicable not only to data stored within the same physical medium, but also to data stored within separate media.

Therefore, in some embodiments, the storage controller 104 may be configured to write data out-of-place. As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. Moreover, writing data out-of-place may remove erasure from the latency path of many storage operations (e.g., the erasure latency is no longer part of the critical path of a write operation). "Storage operation" refers to an operation performed on a memory cell in order to change, or obtain, the value of data represented by a state characteristic of the memory cell. Examples of storage operations include but are not limited to reading data from (or sensing a state of) a memory cell, writing (or programming) data to a memory cell, and/or erasing data stored in a memory cell.

Management of a data block by a storage manager includes specifically addressing a particular data block for a read operation, write operation, or maintenance operation. "Maintenance operation" refers to an operation performed on a non-volatile storage device that is configured, designed, calibrated, or arranged to improve or extend the life of the non-volatile storage device and/or data stored thereon.

A block storage device may associate n blocks available for user data storage across the storage media with a logical address, numbered from 0 to n. In certain block storage devices, the logical addresses may range from 0 to n per volume or partition. "Logical address" refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like. A logical address does not indicate the physical location of data on the storage media but is an abstract reference to the data.

In conventional block storage devices, a logical address maps directly to a particular data block on physical storage media. In conventional block storage devices, each data block maps to a particular set of physical sectors on the physical storage media. However, certain storage devices do not directly or necessarily associate logical addresses with particular physical data blocks. These storage devices may emulate a conventional block storage interface to maintain compatibility with a block storage client 108.

In one embodiment, the storage controller 104 provides a block I/O emulation layer, which serves as a block device interface, or API. In this embodiment, the storage client 108 communicates with the storage device through this block device interface. In one embodiment, the block I/O emulation layer receives commands and logical addresses from the storage client 108 in accordance with this block device interface. As a result, the block I/O emulation layer provides the storage device compatibility with a block storage client 108.

In one embodiment, a storage client 108 communicates with the storage controller 104 through a host interface comprising a direct interface. In this embodiment, the storage device directly exchanges information specific to non-volatile storage devices. "Non-volatile storage device" refers to any hardware, device, component, element, or circuit configured to maintain an alterable physical characteristic used to represent a binary value of zero or one after a primary power source is removed. Examples of a non-volatile storage device include, but are not limited to, a hard disk drive (HDD), Solid-State Drive (SSD), non-volatile memory media, and the like.

A storage device using direct interface may store data in the memory die 112 using a variety of organizational constructs including, but not limited to, blocks, sectors, pages, logical blocks, logical pages, erase blocks, logical erase blocks, ECC codewords, logical ECC codewords, or in any other format or structure advantageous to the technical characteristics of the memory die 112. "Characteristic" refers to any property, trait, quality, or attribute of an object or thing. Examples of characteristics include, but are not limited to, condition, readiness for use, error condition, performance, behavior, electrical current leakage, unreadiness for use, size, weight, composition, feature set, and the like.

The storage controller 104 receives a logical address and a command from the storage client 108 and performs the corresponding operation in relation to the memory die 112. The storage controller 104 may support block I/O emulation, a direct interface, or both.

Figure 2:
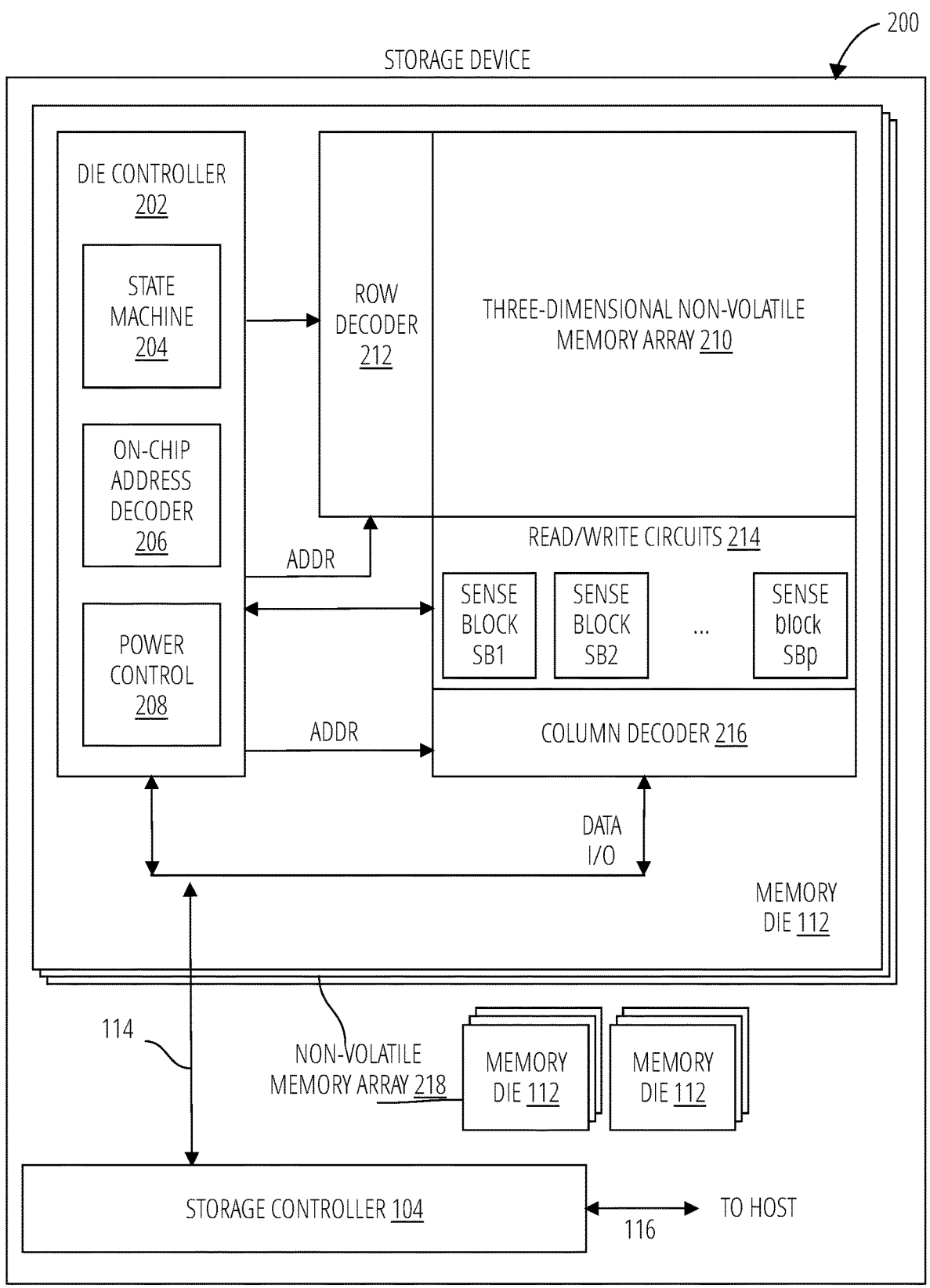
FIG. 2 illustrates a storage device 200 in accordance with one embodiment.

FIG. 2 is a block diagram of an exemplary storage device 200. "Storage device" refers to any hardware, system, subsystem, circuit, component, module, non-volatile memory media, hard disk drive, storage array, device, or apparatus configured, programmed, designed, or engineered to store data for a period of time and retain the data in the storage device while the storage device is not using power from a power supply. Examples of storage devices include, but are not limited to, a hard disk drive, FLASH memory, MRAM memory, a Solid-State storage device, Just a Bunch Of Disks (JBOD), Just a Bunch Of Flash (JBOF), an external hard disk, an internal hard disk, and the like.

The storage device 200 may include a storage controller 104 and a non-volatile memory array 218. Each memory die 112 in the non-volatile memory array 218 may include a die controller 202, at least one non-volatile memory array 210 in the form of a three-dimensional array, and read/write circuits 214. "Three-dimensional non-volatile memory array" refers to a physical arrangement of components of a non-volatile memory array which contrasts with a two-dimensional (2-D) non-volatile memory array. 2-D memory arrays are formed along a planar surface of a semiconductor wafer or other substrate. A three-dimensional (3-D) non-volatile memory array extends up from the wafer surface/substrate and generally includes stacks, or columns, of memory cells extending upwards, in a z-direction. In a 3-D non-volatile memory array word lines comprise layers stacked one on the other as the non-volatile memory array extends upwards. Various 3-D arrangements are possible. In one arrangement a NAND string is formed vertically with one end (e.g., source) at the wafer surface and the other end (e.g., drain) on top.

"NAND string" refers to circuitry that includes a plurality of memory cells. A NAND string includes a series of memory cells configured as transistor (e.g., n=4, 8, 16 or higher) daisy-chained by each memory cell's source electrodes and drain electrodes. At least one pair of select transistors (e.g. Select gates) connect the memory transistor chain, the NAND string, to a bias source by way of the NAND string's drain electrode and to a ground source by way of the NAND string's source electrode.

"Threshold voltage" refers to a voltage level that when applied to a gate terminal of a transistor causes the transistor to conduct a current between the drain electrode and source electrode. "Threshold" refers to a level, point, magnitude, intensity, or value above which a condition is true or will take place and below which the condition is not true or will not take place. (Search "threshold" on Merriam-Webster.com. Merriam-Webster, 2019. Web. 14 Nov. 2019. Edited)

Consequently, a non-volatile memory array is a non-volatile memory array having memory cells configured such that a characteristic (e.g., threshold voltage level, resistance level, conductivity, etc.) of the memory cell used to represent stored data remains a property of the memory cell without a requirement for using a power source to maintain the characteristic.

A non-volatile memory array is addressable using a row identifier and a column identifier. Those of skill in the art recognize that a non-volatile memory array may comprise the set of memory cells within a plane, the set of memory cells within a memory die, the set of memory cells within a set of planes, the set of memory cells within a set of memory die, the set of memory cells within a memory package, the set of memory cells within a set of memory packages, or with other known memory cell set architectures and configurations.

A non-volatile memory array may include a set of memory cells at a number of levels of organization within a storage or memory system. In one embodiment, memory cells within a plane may be organized into a non-volatile memory array. In one embodiment, memory cells within a plurality of planes of a memory die may be organized into a non-volatile memory array. In one embodiment, memory cells within a plurality of memory dies of a memory device may be organized into a non-volatile memory array. In one embodiment, memory cells within a plurality of memory devices of a storage system may be organized into a non-volatile memory array.

The non-volatile memory array 210 is addressable by word line via a row decoder 212 and by bit line via a column decoder 216. "Word line" refers to a structure within a memory array comprising a set of memory cells. The memory array is configured such that the operational memory cells of the word line are read or sensed during a read operation. Similarly, the memory array is configured such that the operational memory cells of the word line are read, or sensed, during a read operation. A word line may also be referred to as a physical page or page for short. "Physical page" refers to physical page represents the smallest storage block within a given memory die that can be written to in a single operation.

"Bit line" refers to a circuit structure configured to deliver a voltage and/or conduct current to a column of a non-volatile memory array. In one embodiment, the column comprises a NAND string or memory string and may also be referred to as channel. In one embodiment, the column is referred to as a NAND string and the NAND string comprises a channel. In one embodiment, a bit line connects to a NAND string at a drain end or drain side of the NAND string. A non-volatile memory array may have one bit line for each memory cell along the word lines of the non-volatile memory array.

"Channel" refers to a structure within a non-volatile memory array that extends from a source side to a drain side. In one embodiment, a channel is a vertical column within a non-volatile memory array that forms a conductive path between a source line coupled to one end of a NAND string and a bit line coupled to another end of the NAND string. A channel may be formed from a variety of materials including, for example, polysilicon.

In one embodiment, a channel within a NAND string creates a conductive path by activating one or more memory cells (e.g., one or more selected memory cells and unselected memory cells) along the NAND string, and one or more control structures (e.g., select gates (source and/or drain) between a source line connected to one end (e.g., the source side) of the NAND string and a sense amplifier or bit line connected to the other end (e.g., the drain side) of the NAND string.

"Select gate" refers to a transistor structurally and/or electrically configured to function as a switch to electrically connect a first electrical structure connected to a source terminal of the transistor to a second electrical structure connected to the drain terminal. When functioning as a switch, the transistor is referred to herein as a 'select gate' and serves to gate (selectively) or control when, and in what quantity, a current flows or a voltage passes between the first electrical structure and the second electrical structure. Depending on the context, references to select gate herein may refer to the whole transistor or to the gate terminal of the transistor.

The read/write circuits 214 include multiple sense blocks SB1, SB2, . . . , SBp (sensing circuitry) and allow a page of memory cells to be read or programmed in parallel. In certain embodiments, each memory cell across a row of the non-volatile memory array together form a physical page. "Read/write circuit" refers to a device, component, element, module, system, sub-system, circuitry, logic, hardware, or circuit configured and/or operational to read data from and write data to a storage media, such as storage cells of a storage array.

A physical page may include memory cells along a row of the non-volatile memory array for a single plane or for a single memory die. In one embodiment, the memory die includes a non-volatile memory array made up of two equal sized planes. In one embodiment, a physical page of one plane of a memory die includes four data blocks (e.g., 16 KB). In one embodiment, a physical page (also called a "die page") of a memory die includes two planes each having four data blocks (e.g., 32 KB).

Commands and data are transferred between the host 102 and storage controller 104 via a data bus 116, and between the storage controller 104 and the one or more memory dies 112 via bus 114. The storage controller 104 may comprise the logical modules described in more detail with respect to FIG. 1.

The non-volatile memory array 210 can be two-dimensional (2D—laid out in a single fabrication plane) or three-dimensional (3D—laid out in multiple fabrication planes). The non-volatile memory array 210 may comprise one or more arrays of memory cells including a 3D array. In one embodiment, the non-volatile memory array 210 may comprise a monolithic three-dimensional memory structure (3D array) in which multiple memory levels are formed above (and not in) a single substrate, such as a wafer, with no intervening substrates. The non-volatile memory array 210 may comprise any type of non-volatile memory that is monolithically formed in one or more physical levels of arrays of memory cells having an active area disposed above a silicon substrate. The non-volatile memory array 210 may be in a non-volatile solid-state drive having circuitry associated with the operation of the memory cells, whether the associated circuitry is above or within the substrate.

Word lines may comprise sections of the layers containing memory cells, disposed in layers above the substrate. Multiple word lines may be formed on single layer by means of trenches or other non-conductive isolating features.

The die controller 202 cooperates with the read/write circuits 214 to perform memory operations on memory cells of the non-volatile memory array 210, and includes a state machine 204, an address decoder 206, and a power control 208. The state machine 204 provides chip-level control of memory operations. "Die controller" refers to a set of circuits, circuitry, logic, or components configured to manage the operation of a die. In one embodiment, the die controller is an integrated circuit. In another embodiment, the die controller is a combination of discrete components. In another embodiment, the die controller is a combination of one or more integrated circuits and one or more discrete components.

The address decoder 206 provides an address interface between that used by the host or a storage controller 104 to the hardware address used by the row decoder 212 and column decoder 216. The power control 208 controls the power and voltages supplied to the various control lines during memory operations. "Control line" refers to a structure, circuit, circuitry, and/or associated logic configured to convey an electrical current and/or voltage from a source to a destination. In certain embodiments, analog voltages, currents, biases, and/or digital signals supplied or discharged over a control line are used to control switches, select gates, and/or other electrical components. Certain control lines may have a specific name based on what parts of a circuit the control line controls or where the control line couples, or connects, to other circuits. Examples of named control lines include word lines, bit lines, source control lines, drain control lines, and the like.

"Source control line" refers to a control line configured to operate a select gate (e.g., turn the select gate on, activate, and off, deactivate) for coupling a source side of a NAND string to a source line and/or another circuit.

"Source side" refers to the end of a NAND string or side of a three-dimensional non-volatile memory array connected to the source layer or line on a memory die. The term comes from the source terminal of a field effect transistor or similar component. In a daisy-chained string of transistors, the source terminal of the first transistor may be connected to a source line, a ground or some other lower voltage line, and the drain terminal may be connected to the source terminal of the next transistor, that transistor's drain terminal may be connected to the next source terminal and so on, with the drain terminal of the final transistor connected to a higher voltage signal or power line. The gate terminal of each transistor may then control whether or not current flows through the transistor from source to drain, and through the string from source line to bit line.

"Source line" refers to a structure, circuit, circuitry, and/or associated logic configured to convey an electrical current and/or voltage from a supply to one or more channels of associated NAND strings. In certain embodiments, a source line is configured to convey a voltage to, and/or discharge a voltage from multiple NAND strings concurrently. In other embodiments, a source line is configured to convey a voltage to, and/or discharge a voltage from multiple NAND strings in series.

In certain embodiments, a source control line couples to one or more source-side select gates that are between the source line and one or more NAND strings and the source control line manages whether voltage or current passes between the source line and the NAND string. In such an embodiment, the source line may also be referred to as a common source line.

"Source-side select gate" refers to a select gate functioning as a switch to electrically connect a source line to a NAND string and/or a channel of a NAND string. Examples of source lines include source-side select gates, dummy word line select gates, and the like. In certain embodiments, a source-side select gate may comprise just source-side select gates (e.g., SGS0, SGS1, etc.). In other embodiments, a source-side select gate may comprise just dummy word line select gates (e.g., DWLS0, DWLS1, etc.). In still other embodiments, a source-side select gate may comprise both source-side select gates (e.g., SGS0, SGS1, etc.) and dummy word line select gates (e.g., DWLS0, DWLS1, etc.). A select gate positioned between the source line and the NAND string on the source side of the NAND string is referred to as a source-side select gate.

"Drain control line" refers to a control line configured to operate a select gate (e.g., turn the select gate on, activate, and off, deactivate) for coupling a drain side of a NAND string to a bit line and/or a sense circuit. "Drain side" refers to the end of a NAND string or side of a three-dimensional non-volatile memory array connected to the bit line(s). The term comes from the drain terminal of a field effect transistor or similar component. In a daisy-chained string of transistors, the source terminal of the first transistor may be connected to a source line, a ground or some other lower voltage line, and the drain terminal may be connected to the source terminal of the next transistor, that transistor's drain terminal may be connected to the next source terminal and so on, with the drain terminal of the final transistor connected to a higher voltage signal or power line. The gate terminal of each transistor may then control whether or not current flows through the transistor from source to drain, and through the string from source line to bit line.

"Drain-side select gate" refers to a select gate functioning as a switch to electrically connect a bit line to a NAND string and/or a channel of a NAND string. A select gate positioned between the bit line and the NAND string on the drain side of the NAND string is referred to as a drain-side select gate.

"Logic" refers to machine memory circuits, non-transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

The power control 208 and/or read/write circuits 214 can include drivers for word lines, source gate select (SGS) transistors, drain gate select (DGS) transistors, bit lines, substrates (in 2D memory structures), charge pumps, and source lines. In certain embodiments, the power control 208 may detect a sudden loss of power and take precautionary actions. The power control 208 may include various first voltage generators (e.g., the drivers) to generate the voltages described herein. The sense blocks can include bit line drivers and sense amplifiers in one approach.

In some implementations, some of the components can be combined. In various designs, one or more of the components (alone or in combination), other than non-volatile memory array 210, can be thought of as at least one control circuit or storage controller which is configured to perform the techniques described herein. For example, a control circuit may include any one of, or a combination of, die controller 202, state machine 204, address decoder 206, column decoder 216, power control 208, sense blocks SB1, SB2, . . . , SBp, read/write circuits 214, storage controller 104, and so forth.

In one embodiment, the host 102 is a computing device (e.g., laptop, desktop, smartphone, tablet, digital camera) that includes one or more processors, one or more processor readable storage devices (RAM, ROM, FLASH memory, hard disk drive, solid state memory) that store processor readable code (e.g., software) for programming the storage controller 104 to perform the methods described herein. The host may also include additional system memory, one or more input/output interfaces and/or one or more input/output devices in communication with the one or more processors, as well as other components well known in the art.

Associated circuitry is typically involved in operation of the memory cells and for communication with the memory cells. As non-limiting examples, memory devices may have circuitry used for controlling and driving memory cells to accomplish functions such as programming and reading.

This associated circuitry may be on the same substrate as the memory cells and/or on a separate substrate. For example, a storage controller for memory read-write operations may be located on a separate storage controller chip and/or on the same substrate as the memory cells.

One of skill in the art will recognize that the disclosed techniques and devices are not limited to the two-dimensional and three-dimensional exemplary structures described but covers all relevant memory structures within the spirit and scope of the technology as described herein and as understood by one of skill in the art.

Figure 3:
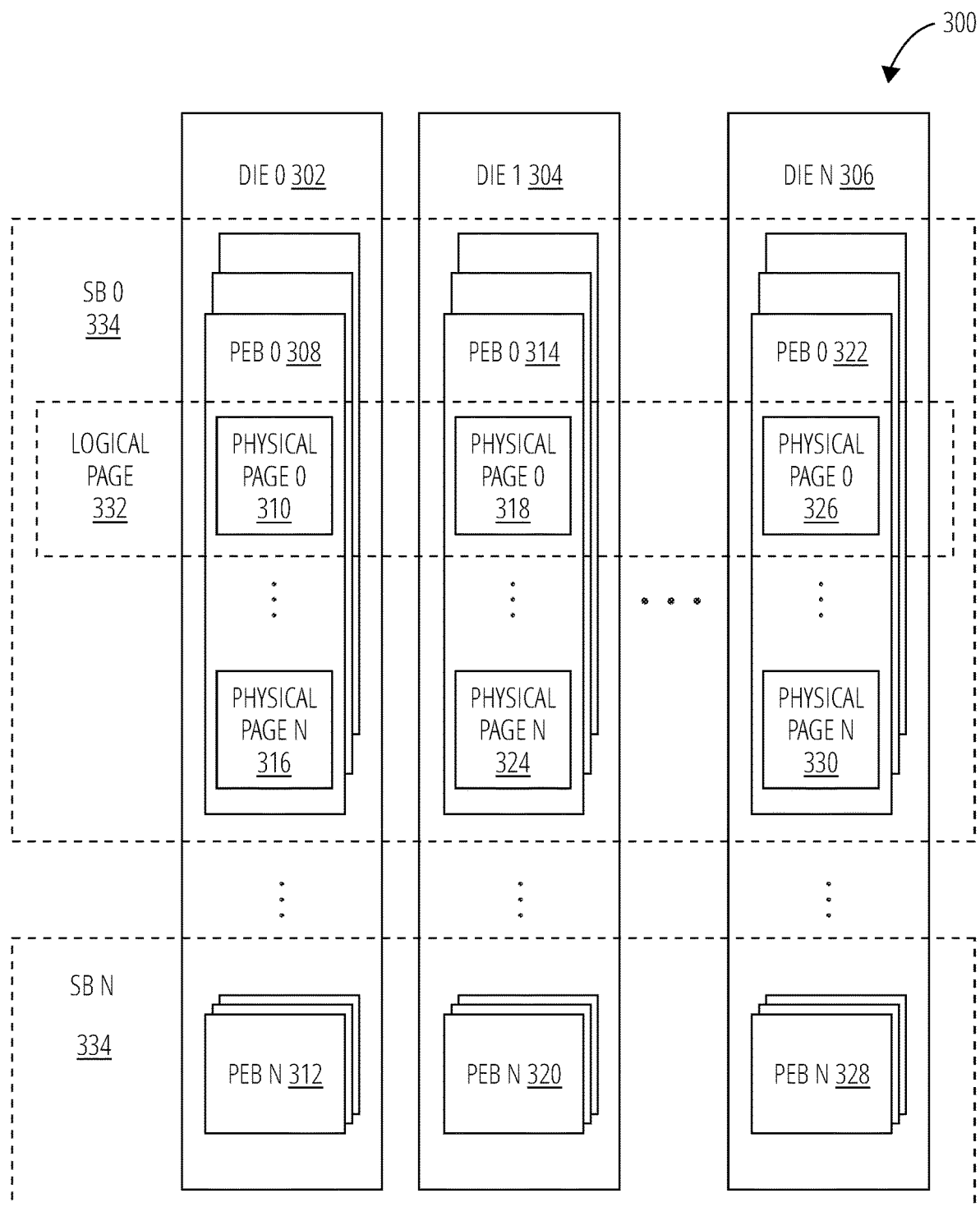
FIG. 3 illustrates a non-volatile memory array 300 in accordance with one embodiment.

FIG. 3 illustrates a Non-volatile memory array 300 in accordance with one embodiment. In the illustrated embodiment, Non-volatile memory array 300 is organized into logical erase blocks (LEBs), as shown by storage block 334 (also referred to herein as a "metablock" or "superblock"). These LEBs include multiple physical erase blocks (PEBs) illustrated by physical erase block 0 308, physical erase block n 312, physical erase block 0 314, physical erase block n 320, physical erase block 0 322, and physical erase block n 328. "Physical erase block" refers to smallest storage unit within a given memory die that can be erased at a given time (e.g., due to the wiring of storage cells on the memory die).

The physical erase blocks may be located in separate storage dies, shown as die 0 302, die 1 304, and die n 306. In certain embodiments, a die is divided into planes. "Plane" refers to a division of a die that permits certain storage operations to be performed on both planes using certain physical row addresses and certain physical column addresses.

Those of skill in the art appreciate the relationship and differences between physical erase blocks and a logical erase blocks and may refer to one, or the other, or both by using the shorthand version erase block, block, or storage block. Those of skill in the art understand from the context of the reference to an erase block whether a physical erase block or a logical erase block (or metablock or superblock) is being referred to. The concepts and techniques used in the art and those recited in the claims can be equally applied to either physical erase blocks or logical erase blocks.

"Storage block" refers to a set of storage cells organized such that storage operations can be performed on groups of the storage cells in parallel. The organization of the set of storage cells may be implemented at a physical level or a logical level. Thus, a storage block, in one embodiment, may comprise a physical page, such as a word line, a logical page comprising physical pages that span planes and/or memory die, a physical erase block comprising a set of physical pages, a logical erase block (LEB) comprising a set of logical pages, or the like. A storage block may be referred to herein as a "block", a "memory block", a "metablock," or a LEB.

As used herein, a "physical" structure such as a physical page, physical word line, physical erase block, physical plane, physical memory die, or the like, refers to a single physical structure that a controller, manager, module, or other logic component of a system can control and/or communicate with at some level within one or more levels of physical abstraction in the organization of the device, system, or apparatus. Similarly, a "logical" structure such as a logical page, logical word line, logical erase block, logical plane, logical memory die, or the like, refers to a collection of two or more single physical structures of that same type that a controller, manager, module, or other logic component of the system can control and/or communicate with at some level within one or more levels of physical abstraction in the organization of the device, system, or apparatus. It should be noted that one or the other or both a "physical" structure and a "logical" structure may have distinct addresses that can be used to identify one "physical" structure or "logical" structure relative to other structures of a similar nature and type.

"Logical erase block" refers to another term for a storage block. In certain embodiments, a logical erase block refers to a set of logical pages that span planes, memory die, and/or chips. This organization of storage cells is deemed 'logical' because the physical pages may not be directly coupled to each other. However, the physical pages are operated in parallel as though they are a single page. In like manner, multiple physical erase blocks may be operated in parallel as though they are a single erase block and are thus referred to as logical erase blocks. The terms logical erase block, metablock, and super block are used interchangeably herein.

"Logical page" refers to a collection of physical page that are treated as a single page for storage operations.

A logical erase block such as storage block 334 is further divided into multiple logical pages (logical page 332) that, in turn, includes multiple physical pages, such as physical page 0 310, physical page n 316, physical page 0 318, physical page n 324, physical page 0 326, and physical page n 330. Physical pages may include multiple packets, which may be grouped into error correction code (ECC) chunks.

In one embodiment, a physical page represents the smallest storage block within a given die that can be written to at a given time. In one embodiment, a logical page is the smallest writable storage block supported by the storage controller. (in one embodiment, the storage controller may include a buffer configured to store up to a logical page worth of data; upon filling the buffer, the storage controller may write the contents of the buffer to a single logical page simultaneously.) In some instances, dividing a logical page across multiple dies may result in faster access times for a set of data when multiple dies are accessed in parallel. The logical page configurations may be mapped to any physical page on a die, or across a plurality of memory dies, just as with logical erase blocks.

In some embodiments, a storage controller 104 may associate metadata, also referred to as media characteristics, with one or more of the storage blocks (logical erase blocks, physical erase blocks, logical pages, and/or physical pages). The storage controller 104 may manage metadata that identifies logical addresses for which a logical erase block stores data, as well as the respective numbers of stored data packets for each logical erase block, data block, or sector within a logical address space. A storage controller 104 may store metadata or media characteristic data in a variety of locations, including on non-volatile storage media, in volatile memory, in a structure stored with each logical erase block, or the like.

"Media characteristic" refers to an attribute or statistic for a set of particular storage cells, such as a program/erase cycle count for the set of storage cells, a read count for the set of storage cells, a retention time since a previous write for the set of storage cells (aka a data retention time), a dwell time for the set of storage cells such as a logical or physical erase block (e.g., a time between a program of an erase block and an erase of the erase block), an average of multiple previous dwell times for the set of storage cells, an error statistic for the set of storage cells, or the like.

A media characteristic for a set of storage cells may be static or may be dynamic and change over time. A media characteristic, in one embodiment, is a statistic, heuristic, mathematical model, transform, or other descriptor associated with an attribute of the non-volatile memory media.

A media characteristic, in one embodiment, includes or relates to a make, a model, a manufacturer, a product version, or the like for the storage device and/or for the non-volatile memory media. A media characteristic, in a further embodiment, may include or relate to an environmental condition or a use of the storage device and/or of the non-volatile memory media, such as a temperature, a use case (e.g., a cache use case, an archival use case, a server use case, an enterprise use case, a consumer use case, etc.), or the like.

Figure 4:
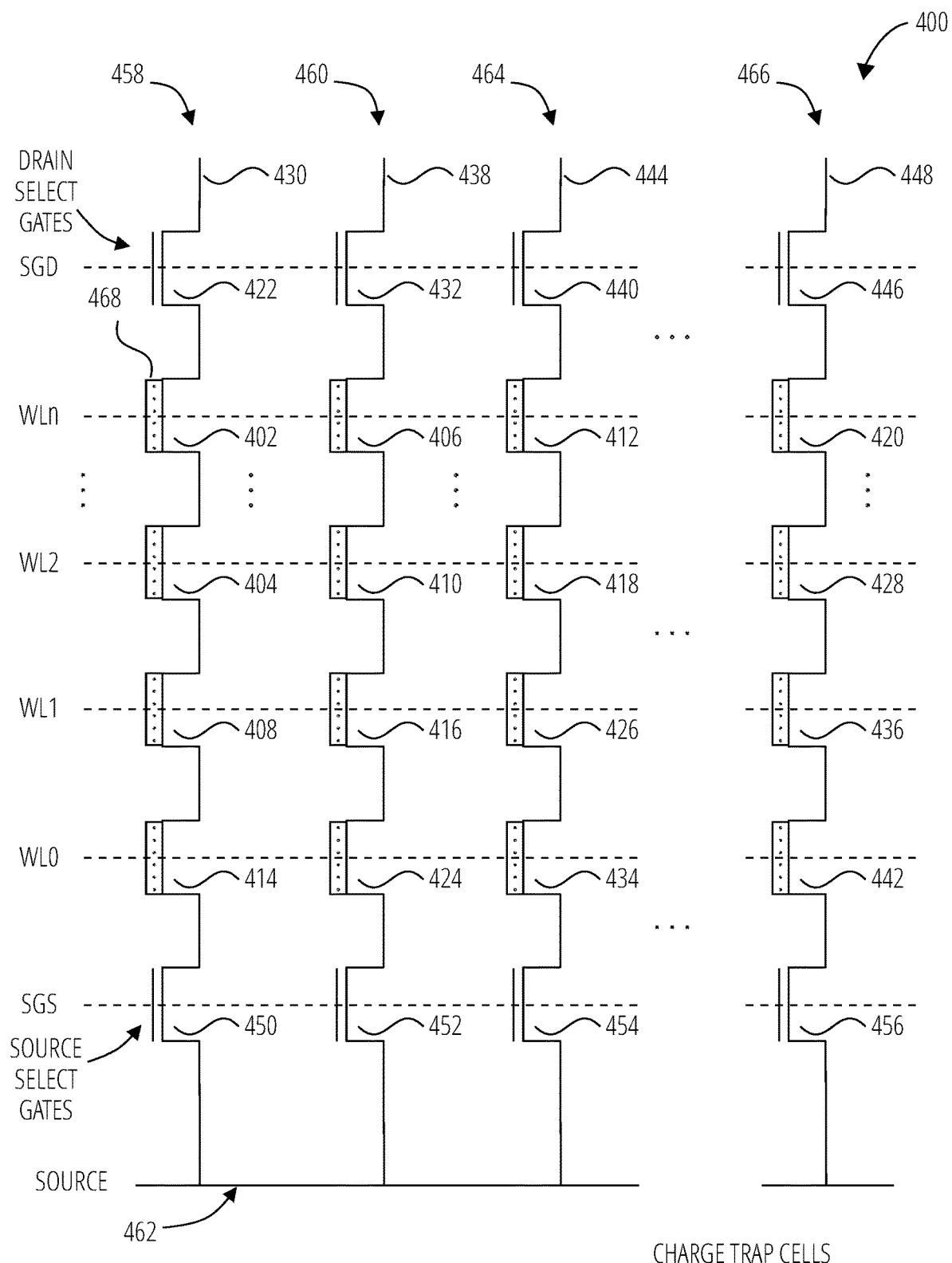
FIG. 4 is a schematic block diagram illustrating one embodiment of an array of storage cells 400.

FIG. 4 is a circuit diagram depicting an array of storage cells 400 comprising a plurality of NAND strings. An architecture for a flash memory system using a NAND structure may include several NAND strings. For example, FIG. 4 illustrates an array of storage cells 400 that includes multiple NAND strings (NAND string 458, NAND string 460, NAND string 464, and NAND string 466). In the depicted embodiment, each NAND string includes drain select transistors (select transistor 422, select transistor 432, select transistor 440, and select transistor 446), source select transistors (select transistor 450, select transistor 452, select transistor 454, select transistor 456), and storage elements (storage element 402, storage element 404, storage element 408, storage element 414, storage element 406, storage element 410, storage element 416, storage element 424, storage element 412, storage element 418, storage element 426, storage element 434, storage element 420, storage element 428, storage element 436, and storage element 442). The storage elements may be transistors that incorporate a charge trap layer 468. While four storage elements per NAND string are illustrated for simplicity, some NAND strings can include any number of storage elements, e.g., thirty-two, sixty-four, or the like storage elements.

NAND string 458, NAND string 460, NAND string 464, and NAND string 466, in one embodiment, are connected to a source line 462 by source select transistor 450, select transistor 452, select transistor 454, and select transistor 456, respectively. A selection line SGS may be used to control the source side select transistors. The various NAND strings, in one embodiment, are connected to bit line 430, bit line 438, bit line 444, and bit line 448 by drain select transistor 422, select transistor 432, select transistor 440, and select transistor 446, respectively, as shown. The drain select transistors may be controlled by a drain select line SGD. In some embodiments, the select lines do not necessarily need to be in common among the NAND strings; that is, different select lines can be provided for different NAND strings.

As described above, each word line WL0-WLn comprises one or more storage elements. In the depicted embodiment, each of bit line 430, bit line 438, bit line 444, and bit line 448, and the respective NAND string 458, NAND string 460, NAND string 464, and NAND string 466, comprise the columns of the array of storage cells 400, storage block, erase block, or the like. The word lines WL0-WLn, in some embodiments, comprise the rows of the array of storage cells 400, storage block, erase block, or the like. Each word line WL0-WLn, in some embodiments, connects the control gates of each storage element in a row. Alternatively, the control gates may be provided by the word lines WL0-WLn themselves. In some embodiments, a word line WL0-WLn may include tens, hundreds, thousands, millions, or the like of storage elements.

In one embodiment, each storage element is configured to store data. For example, when storing one bit of digital data, the range of possible threshold voltages ("VTH") of each storage element may be divided into two ranges which are assigned logical data "1" and "0." In one example of a NAND type flash memory, the VTH may be negative after the storage elements are erased and defined as logic "1." In one embodiment, the VTH after a program operation is positive and defined as logic "0."

When the VTH is negative and a read is attempted, in some embodiments, storage elements will turn on to indicate logic "1" is being stored. When the VTH is positive and a read operation is attempted, in a further embodiment, a storage element will not turn on, which indicates that logic "0" is stored. Each storage element may also store multiple levels of information, for example, multiple bits of digital data. In such an embodiment, the range of VTH value is divided into the number of levels of data. For example, if four levels of information can be stored in each storage element, there will be four VTH ranges assigned to the data values "11", "10", "01", and "00."

In one example of a NAND type memory, the VTH after an erase operation may be negative and defined as "11." Positive VTH values may be used for the states of "10", "01", and "00." In one embodiment, the specific relationship between the data programmed into the storage elements and the threshold voltage ranges of the storage elements depends upon the data encoding scheme adopted for the storage elements.

In some embodiments, when a read operation is performed, a read error may occur on one or more storage elements, which may be a result of an insufficient cell current provided by the one or more storage elements (e.g., an "ON" cell current flowing through the floating gate transistor over the bit line during a read operation, or the like). For example, an ON current for different storage elements storing the same data may vary, causing read errors. A read level determination component may adjust a read level, such as a bias voltage of a bit line, applied to the one or more storage elements to reduce a number of read errors by compensating for the low cell current from one or more of the storage elements.

The techniques presented herein allow for the detection of leakage current on one or more word lines while the word line has a high voltage applied internally.

There is an ongoing effect to reduce memory devices to ever smaller scales. As the technology scales down to 20 nm and 10 nm memory cells, for example, the distance between the word lines are consequently 20 nm or 10 nm. Tolerances become more important and the structure/device is more prone to defects that can cause word lines to leak current to the substrate or short to adjacent word lines. Current leakage correlates with dies that fail cycling due to grown defects and that detectable leakage seems to precede actual program status failure.

The claimed solutions enable word line leakage tests automatically and internal to flash memory, and in a way that can be done with various voltage biases and multiple stress topologies. The claimed solutions can also be done in the field after chip is packaged and further allow to system detect different leakage levels.

Word line leakage current may be on the order 100 nano Amperes at high voltage stress such as 10 to 20 Volts. The difficulty of detecting such a small current at high voltage is due, in part, to the current NAND architecture. This can be illustrated with FIG. 5.

The planes of a memory circuit can have on the order of several thousand storage blocks, one of which is shown as storage block 502 and each storage block may have several dozen word lines, three of which are explicitly shown as WLn−1 504, WLn 506, and WLn+1 508. The high voltage is normally applied on the selected word lines, such as WLn 506 during program and read operations. "Selected word lines" refers to a word line designated for use in a particular storage operation or memory operation. Certain storage operations such as programming, reading, or sensing, may be performed on memory cells of a selected word line through a series of one or more steps. Other storage operations such as erasing memory cells, in one embodiment, may be performed on memory cells of a plurality of word lines simultaneously through a series of one or more steps. In such embodiments, the erase operation may be performed on multiple selected word lines.

The NAND architecture also incurs a very small area penalty of the word line voltage drivers. "Word line voltage" refers to a voltage applied to a word line. In one embodiment, a word line voltage comprises a voltage level used to program memory cells of a non-volatile memory array and is represented by the symbol VPGM. The driver is typically connected to the word lines from one end of the word line array.

High voltage VPGM is generated by a pump (discussed below with respect to FIG. 6A (deleted)) and supplied to the first decoding CGN block 510, represented here as a switch. CGN block 510 is a storage block to supply the various kinds of voltages (typically 3 to 5) according to the mode of operations for each global control gate (CG) control lines. Three of the CG lines (CGn+1 512, CGn 514, CGn−1 516) are shown explicitly, corresponding to the illustrated word lines. The CG lines (as many as the number of word lines in each storage block) will rout to the row (storage block) decoder of the memory array. As indicated by the ellipses, the CG lines run to the other storage blocks of the array in addition to the shown storage block 502, so that these CG lines usually route with the top metal layer and run through the row decoders of the planes (not illustrated).

The switching circuit 500 is configured to deliver a high voltage such as VPGM to a combination of word lines of a storage block. For example, the switching circuit 500 may enable a single word line to receive VPGM or a combination of word lines to receive VPGM, such even numbered word lines and/or odd numbered word lines.

In one embodiment, each storage block is decoded with a local pump. When the storage block is selected, a logic signal enables the local pump to apply a high passing voltage transferG on the gates of a combination of passing transistors (here represented by passing transistor 518, passing transistor 520, and passing transistor 522 for the three illustrated word lines) in the row decoder. Logic may activate a combination of switches such as SW 0 524, SW 1 526, SW 2 528 to control the gates of the passing transistors such that the high voltage VPGM is coupled to the selected word lines, such as even selected word lines (WLn−1 504 and WLn+1 508).

The high voltage, VPGM, on the correspond global CG, CGN block 510, is transferred to the word line(s) of the selected storage block. Here, by way of example, WLn−1 504 and WLn+1 508 are coupled to VPGM, with WLn 506 taken to ground (or more generally a low voltage level), corresponding to a word line to word line leakage test pattern that checks for leakage current through even selected word lines.

Figure 5:
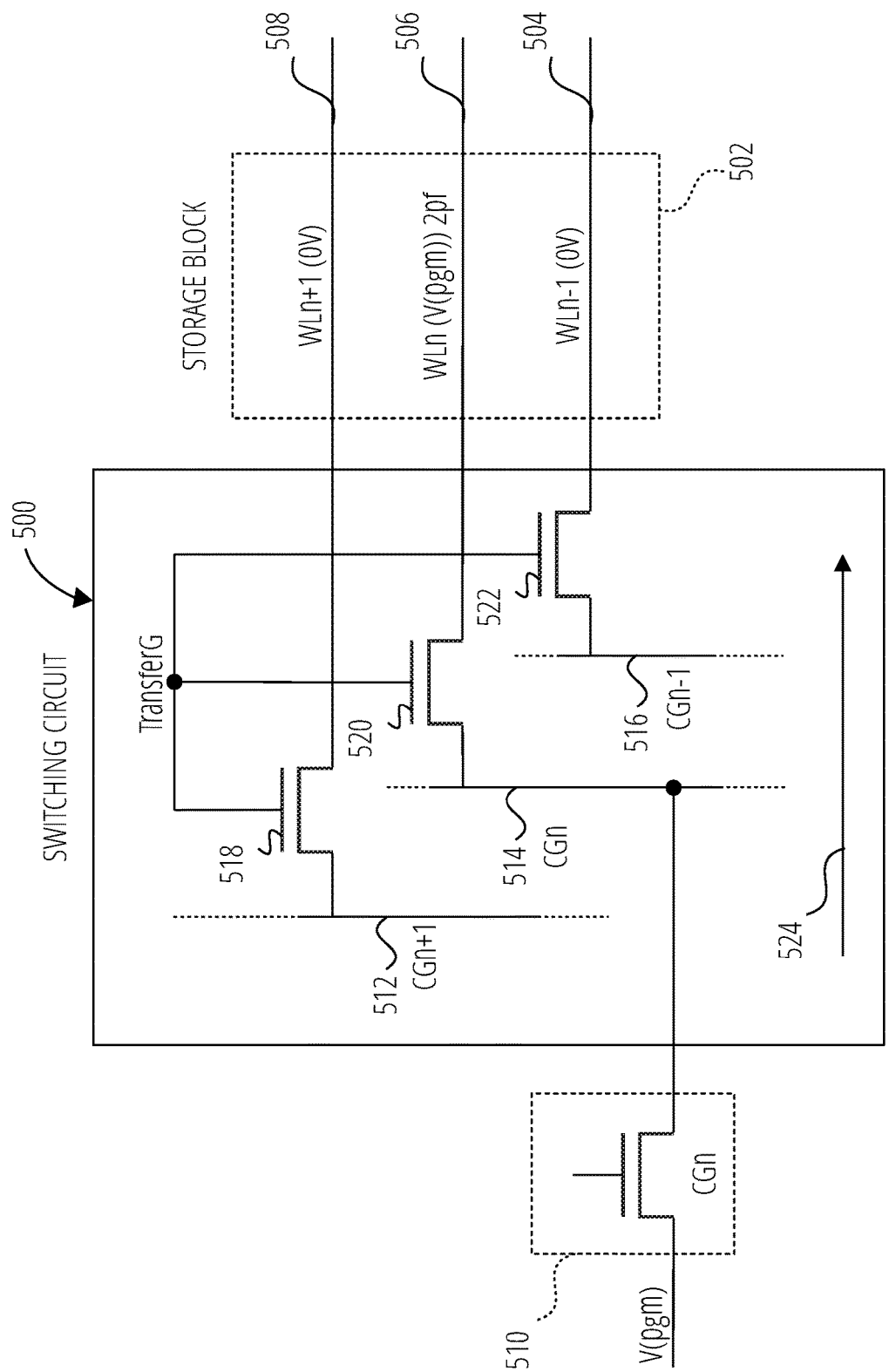
FIG. 5 illustrates a switching circuit 500 in accordance with one embodiment.

During one or more different word line leakage tests, the word lines can have different bias topology according to the defects to be detected. When detecting word line to substrate short, all the word lines may be biased to high voltage of a same level, with the substrate coupled/biased to ground. When detecting word line to neighbor word line shorts, the word lines in the storage block may be biased alternatively at high voltage (VPGM) and 0 volts, as shown in FIG. 5.

The switching circuit 500 facilitates coupling of selected word lines to VPGM for leakage current testing. "Switching circuit" refers to a circuit, sub-circuit, circuitry, electronic component, hardware, software, firmware, module, logic, device, or apparatus configured, programmed, designed, arranged, or engineered to couple one electronic component or circuit with another. In one embodiment, the switching circuit is configured to couple a set of word lines with a leakage detection circuit This switching circuit 500 may be used as described above to direct/couple/supply a reference voltage and/or reference current to a leakage detection circuit as part of a leakage current test and to direct a reference voltage and/or reference current to a particular set of word lines, such as those shown in storage block 502 as part of a leakage current test. "Reference voltage" refers to a voltage configured to serve as a reference when conducting one or more tests of an electronic circuit. In one embodiment, a reference voltage may be used to provide voltage to test circuitry such as a leakage detection circuit. In certain embodiments, a reference voltage may be configured to have a magnitude designed for a test performed using the test circuitry. In another embodiment, an existing voltage for an electronic device may be re-purposed for use in providing voltage to test circuitry such as a leakage detection circuit. For example, in one embodiment, the leakage detection circuit may be couplable to word lines of a non-volatile memory array and the reference voltage may comprise a programming voltage, identified as VPGM.

The switching circuit 500 may incur, include, have, experience, or comprise a junction leakage current 524, based on process, voltage, and temperature (PVT) variations. "Junction leakage current" refers to an amount of current measured in Amperes for a variety of electronic components, switches, control lines, paths and the like in an electronic circuit path between one or more word lines in a non-volatile memory array and a leakage detection circuit. "Process, Voltage, Temperature variations" or "PVT" refers to process variations, voltage level differences, and temperature differences between two fabricated semiconductor devices.

In certain embodiments, the test for leakage current is configured to account for the PVT variations through the switching circuit such that leakage current as low as 25 nanoAmps is detectable. The claimed embodiments included herein may account for the PVT and associated junction leakage current 524 by first determining a reference code and then using the reference code to evaluate a leakage code. Accordingly, the reference current is configured to account for this junction leakage current 524. In the disclosed solution, the CGN block 510 may be used to supply the reference voltage V (pgm) to the switching circuit 500 in order to determine a reference code and also to the selected word lines in order to determine a leakage code, as described in greater detail below.

Figure 6:
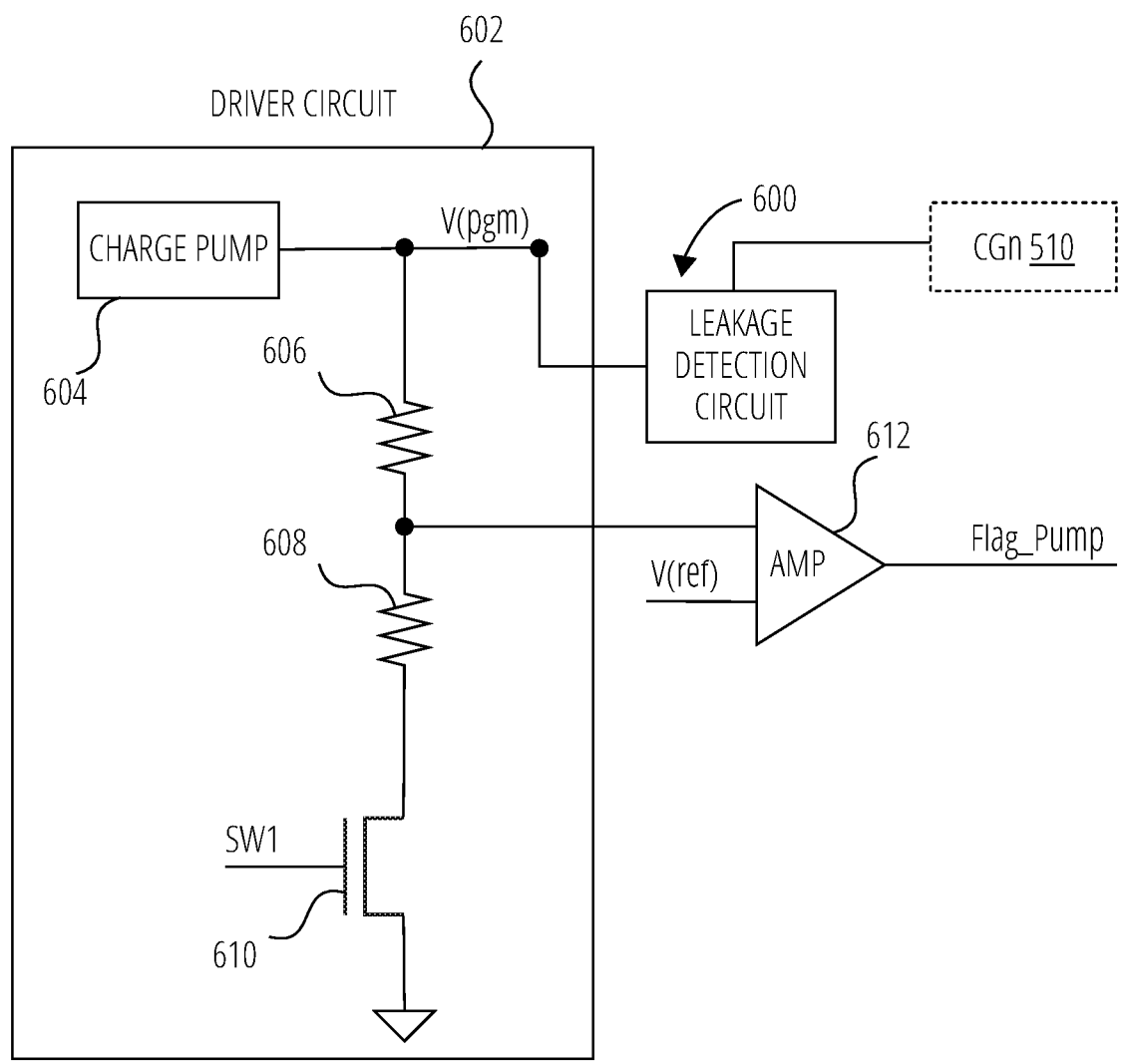
FIG. 6 illustrates a leakage detection circuit 600 in accordance with one embodiment.

FIG. 6 illustrates a driver circuit 602 that includes a charge pump 604 coupled to a leakage detection circuit 600. A high voltage charge pump 604 may be regulated by a resistor divider, such as shown in FIG. 6. The high voltage VPGM is divided by the resistor 606 and resistor 608, connected to ground (or more generally the low voltage level) through the switch 610, and the compare point voltage for the amp 612 will be voltage reference vref of usually around 1.2 volts. The resistor chain may have a leakage current of about 10 µA. The differential amplifier or comparator (amp 612) may be used to output a digital voltage flag-pump which to control a pump clock. "Comparator" refers to an electronic component configured to compare two analog input signals and activate an analog output signal when a magnitude of one of the input signals exceeds a magnitude of the other input signal. When the charge pump 604 is pumped to the target level, the flag_pump will be low to turn off the pump clock. When the high voltage drops below certain level, the flag_pump signal will go high to enable the pump clock and turn on the pump to supply high voltage.

The indicated components, described in detail above, may comprise a driver circuit 602 in accordance with one embodiment of the disclosed solution. "Driver circuit" refers to a circuit, sub-circuit, circuitry, electronic component, hardware, software, firmware, module, logic, device, or apparatus configured, programmed, designed, arranged, or engineered to supply a voltage, either in analog or digital wave form, to another circuit, sub-circuit, electronic component, logic, device, or apparatus.

This driver circuit 602 may supply a word line voltage, and/or a reference voltage, such as V (pgm) to leakage detection circuit 600 and to a set of word lines to detect leakage current from the set of word lines. "Leakage detection circuit" refers to a circuit, sub-circuit, circuitry, electronic component, hardware, software, firmware, module, logic, device, or apparatus configured, programmed, designed, arranged, or engineered to sense/detect/determine current leakage current within, or from, one or more target control lines that are tested or checked for leakage current. In one embodiment, the target control lines may comprise one or more of word lines, bit lines, NAND strings, memory cells, and the like.

Figure 7:
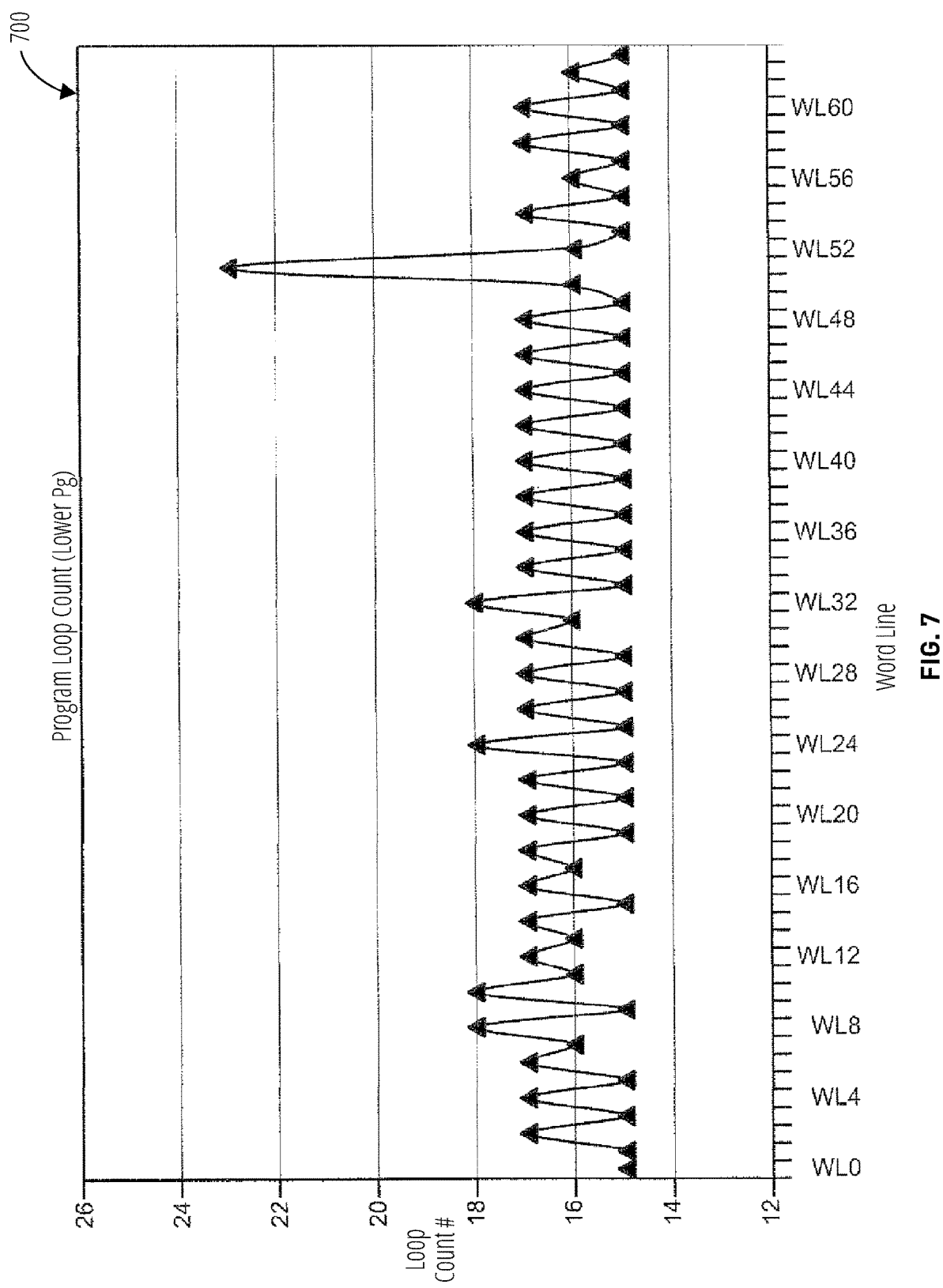
FIG. 7 illustrates a graph indicating leakage current in word lines 700.

FIG. 7 illustrates a graph indicating leakage current in word lines 700. The reason for a double hump distribution is that the part of word line at far end of a word line driver shows a voltage drop. As a result, the cells that are located at the far end of the word line program slower. Programming a broken word line may show some program loop variation, but word line-word line and storage block-storage block variation may make it difficult to judge the failure based on the program loop count.

FIG. 7 shows the number of pulse-verify, iterations, or loop count, for each word line to program, in this example, lower page into a 64 word line storage block. As shown there, the loop count fluctuates over the different word lines by several counts. These variations can reflect fluctuations due to the design particulars, such as whether it is an edge word line or a central word line, or how many erase-program cycle the word line has experienced, as well as process variations. In the case of WL50, the loop count is noticeably higher than the other fluctuations, indicating what may likely be a broken, or shorted, word line.

Memory devices may include a scan to check for failed memory bits when programming. The exemplary embodiments claimed herein may incorporate word line leakage detection into such a routine, which can have several advantages. The disclosed embodiments allow a broken/leaking word line check to be performed many times after the device has been in operation, exemplary embodiments may detect up breakages that manifest themselves after device test, use by a customer, or that are not detectable at every test.

Figure 8:
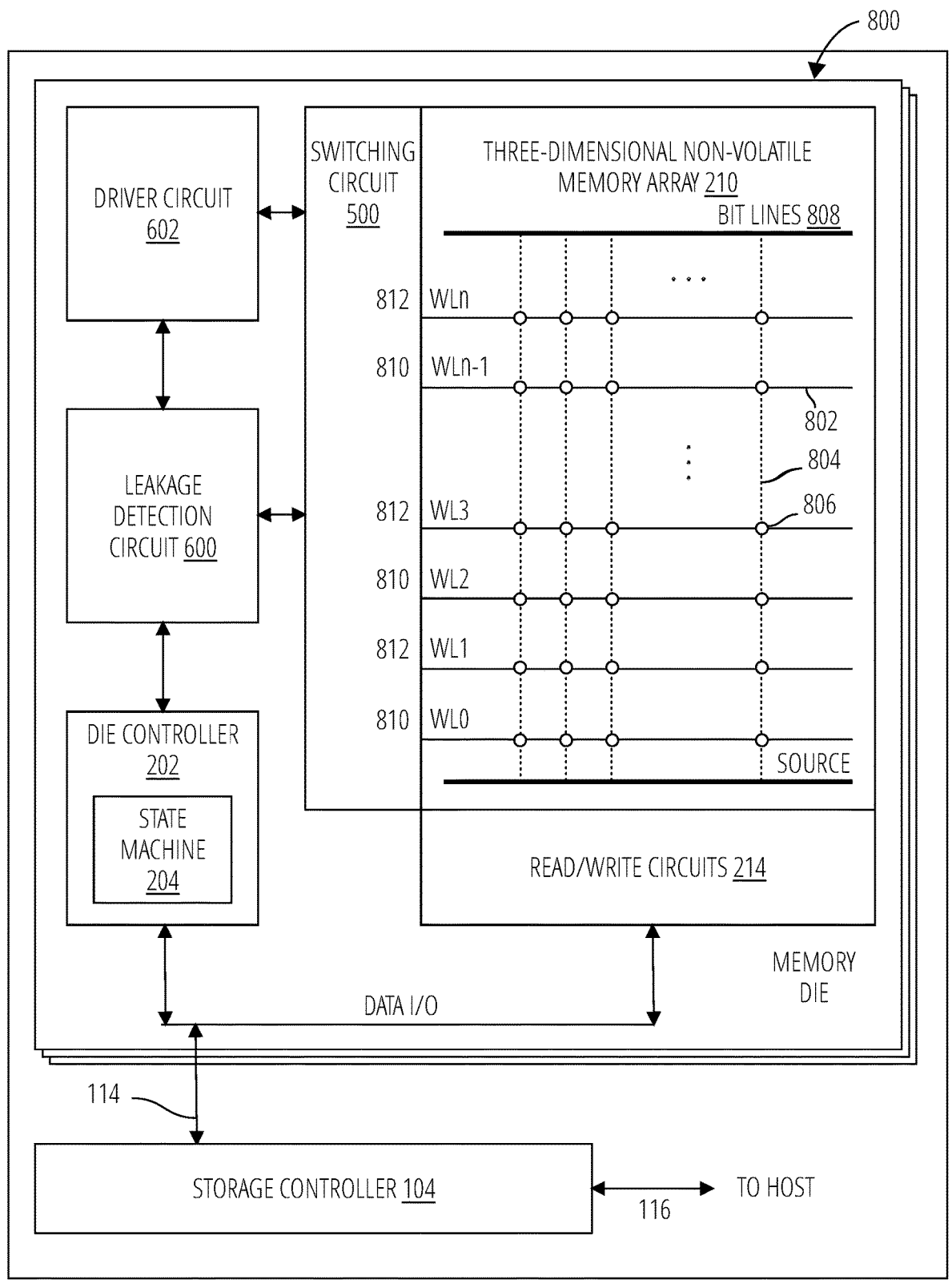
FIG. 8 illustrates a memory die 800 in accordance with one embodiment.

FIG. 8 illustrates a memory die 800 in accordance with one embodiment, implementing the solution disclosed herein. The memory die 800 may comprise a die controller 202 incorporating a state machine 204 and in communication with read/write circuits 214 and a non-volatile memory array 210. The memory die 800 may further comprise a driver circuit 602 and leakage detection circuit 600. The driver circuit 602 and leakage detection circuit 600 may couple to the non-volatile memory array 210 by way of the switching circuit 500.

The non-volatile memory array 210 may comprise word lines 802 coupled to NAND strings 804 running between a source line and bit lines 808. The memory cells 806 are formed along the NAND strings 804 and are positioned where the NAND strings 804 intersects the word lines.

The word lines 802 may be consecutively numbered starting from the source line to the bit lines. The word lines 802 may be grouped and selected for leakage current detection, using a pattern of even selected word lines 810 and odd selected word lines 812 in one embodiment. In other words, a leakage current detection test may be performed separately on even selected word lines 810 and on odd selected word lines 812.

"Even selected word lines" refers to word lines designated for use in a particular storage operation or memory operation, and having an "even" designator, in contrast with word lines having "odd" designators. This designation may be based on a counted number associated with the word line, beginning with "WL0" to designate the word line physically closest to the substrate, with "0" being considered an even designation, and "WL1" being the word line physically above WL0 and farther from the substrate, with "1" being considered an odd designation, etc. Certain storage operations such as programming, reading, or sensing, may be performed on memory cells of a selected word line through a series of one or more steps. Other storage operations such as erasing memory cells, in one embodiment, may be performed on memory cells of a plurality of word lines simultaneously through a series of one or more steps. In such embodiments, the erase operation may be performed on multiple selected word lines.

"Odd selected word lines" refers to word lines designated for use in a particular storage operation or memory operation, and having an "odd" designator, in contrast with word lines having "even" designators. This designation may be based on a counted number associated with the word line, beginning with "WL0" to designate the word line physically closest to the substrate, with "0" being considered an even designation, and "WL1" being the word line physically above WL0 and farther from the substrate, with "1" being considered an odd designation, etc. Certain storage operations such as programming, reading, or sensing, may be performed on memory cells of a selected word line through a series of one or more steps. Other storage operations such as erasing memory cells, in one embodiment, may be performed on memory cells of a plurality of word lines simultaneously through a series of one or more steps. In such embodiments, the erase operation may be performed on multiple selected word lines.

The driver circuit 602 may supply a word line voltage to a set of the word lines 802 to detect leakage current, which may be represented by a leakage code, from those word lines 802. The driver circuit 602 may also supply a word line voltage, such as a reference voltage to a leakage detection circuit 600 as part of a leakage current detection test in which the leakage detection circuit 600 determines a reference code.

In one embodiment, the non-volatile memory array 210 of the memory die 800 may comprise one or more planes, each comprising a plurality of storage blocks. The die controller 202 may iteratively test a set of even selected word lines 810 and odd selected word lines 812 within each storage block to detect leakage current among the even selected word lines and odd selected word lines in turn. The word line voltage from the driver circuit 602 may be selectively coupled to particular sets of word lines through the switching circuit 500.

The die controller 202 may direct the leakage detection circuit 600 to conduct one or more leakage current tests. In certain embodiments, the die controller 202 may use the leakage detection circuit 600 to determine a reference code and then use that reference code in evaluating a leakage code.

The leakage detection circuit 600 may determine a reference code that comprises, or serves as a leakage current threshold. "Reference code" refers to a digital output code configured to represent a binary encoding for a leakage current threshold that incorporates fluctuations, variations, anomalies, or the like in electrical circuitry that is used to measure a particular electrical characteristic or attribute. In one embodiment, a reference code is used as part of a process or method for determining an amount of leakage current, the leakage current being the electrical characteristic measured. "Leakage current threshold" refers to a threshold that represents a total amount of leakage current one or more word lines can have and maintain a usable condition.

In one embodiment, the leakage current threshold is configured to account for other current in a circuit path for a leakage detection circuit. For example, the leakage current threshold may be configured to account for current in the circuit path such as junction leakage current, common mode current, and the like. The die controller 202 may also direct the leakage detection circuit 600 to determine a leakage code that comprises a leakage current from the set of word lines being tested.

The die controller 202 may compare the reference code and the leakage code provided by the leakage detection circuit 600. If the leakage code exceeds the reference code, the die controller 202 may determine that the set of word lines tested has unacceptable leakage current. In one embodiment, the die controller 202 may employ the leakage detection circuit 600 to perform leakage current detection on a subset of the set of word lines such that specific word lines with a fault that is causing the unacceptable leakage current is identified.

In another embodiment, the non-volatile memory array 210 of the leakage detection circuit 900 may comprise two planes (not shown). Each plane may be organized into a plurality of physical erase blocks. Each physical erase block may comprise word lines 802 having memory cells 806 coupled to NAND strings 804 coupled to bit lines 808.

A driver circuit 602 may supply a word line programming voltage, such as V (pgm) as described above, to selected word lines within each of the plurality of physical erase blocks. The voltage supplied by the driver circuit 602 may be configured to be high enough voltage to represent a worst case condition under which leakage current may occur. As such, the word line programming voltage may be used out of convenience, as a representative high voltage that may be expected under normal operating conditions, and also because using a rated voltage of the device may eliminate the risk of this test causing damage to the die.

The die controller 202 of this embodiment may direct the leakage detection circuit 600 to determine a reference code comprising a leakage current threshold. The die controller 202 may direct the leakage detection circuit 600 to determine an even leakage code that comprises leakage current from even selected word lines 810. "Even leakage code" refers to a leakage code configured to reference a level of leakage current from evenly numbered word lines in a non-volatile memory array (either within a single plane or across multiple planes of a memory die). The die controller 202 may then compare the reference code and the even leakage code and determine that the even selected word lines 810 have unacceptable leakage current if the even leakage code exceeds the reference code.

Similarly, the die controller 202 may direct the leakage detection circuit 600 to determine an odd leakage code comprising leakage current from odd selected word lines 812. The die controller 202 may compare the reference code and odd leakage code, and, if the odd leakage code exceeds the reference code, the die controller 202 may determine that the odd selected word lines 812 have unacceptable leakage current. "Odd leakage code" refers to refers to a leakage code configured to reference a level of leakage current from oddly numbered word lines in a non-volatile memory array (either within a single plane or across multiple planes of a memory die).

Figure 9:
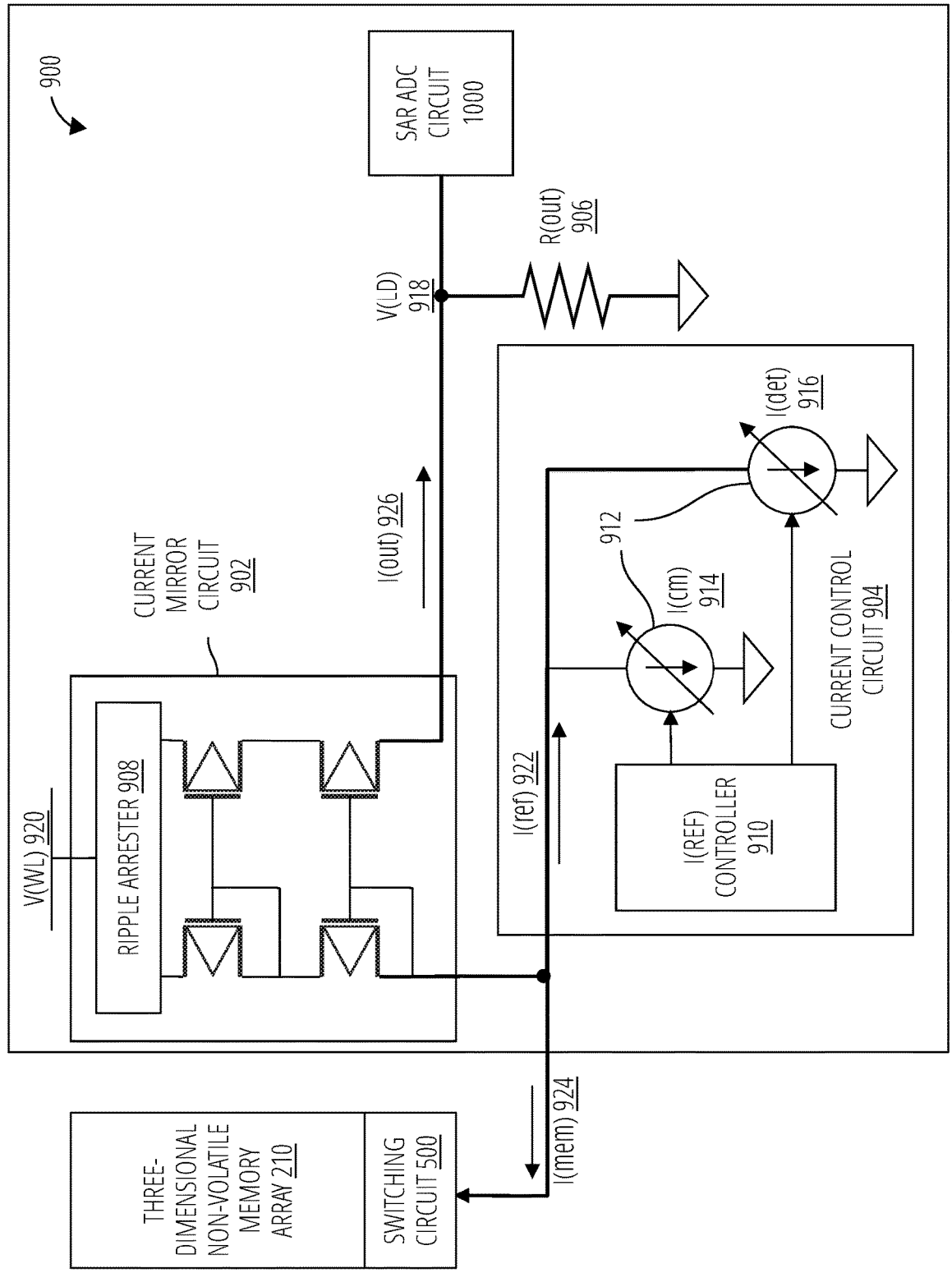
FIG. 9 illustrates a leakage detection circuit 900 in accordance with one embodiment.

FIG. 9 illustrates a leakage detection circuit 900 in accordance with one embodiment. The leakage detection circuit 900 comprises a current mirror circuit 902, a current control circuit 904, a resistor 906, and a SAR ADC circuit 1000. The current mirror circuit 902 may include a ripple arrester 908. The current control circuit 904 may comprise a reference current controller 910 and variable current sources 912, including a common mode current 914 and a detection current 916.

The current control circuit 904 together with logic, the switching circuit 500, and certain other switches manages the leakage detection circuit 900 to obtain a reference code and a leakage code. "Current control circuit" refers to a circuit, sub-circuit, circuitry, electronic component, hardware, software, firmware, module, logic, device, or apparatus configured, programmed, designed, arranged, or engineered to supply a one or more currents from one or more current sources. In one embodiment, one or more of the one or more current sources controlled by the current control circuit may comprise variable/configurable current sources. In particular, in one embodiment, another controller, such as a storage controller, may define a current level for each of the one or more variable current sources by way of the current control circuit. The current control circuit 904 uses variable current sources 912 to manage and configure the testing for leakage current. "Variable current source" refers to a circuit, sub-circuit, circuitry, electronic component, hardware, software, firmware, module, logic, device, or apparatus configured, programmed, designed, arranged, or engineered to serve as a current source for current at a predetermined and adjustable magnitude.

The current control circuit 904 may supply the reference current 922 used to determine the leakage current threshold in order to detect leakage current within the set of word lines of the non-volatile memory array 210 selected by the switching circuit 500. In order to generate the reference current 922, the current control circuit 904 may include a reference current controller 910 configured to control variable current sources 912. The variable current sources 912 may be set, or configured, to draw a current consistent with normal operation of the memory die design, in the form of detection current 916. In some embodiments, the variable current sources 912 may also be configured to draw a common mode current 914 in order to maintain the operation of the current mirror circuit 902. "Common mode current" refers to a current that flows in the same direction as another current in a control line.

The current control circuit 904 connects to the current mirror circuit 902. "Current mirror circuit" refers to a circuit, sub-circuit, circuitry, electronic component, hardware, software, firmware, module, logic, device, or apparatus configured, programmed, designed, arranged, or engineered to mirror/copy a current through one active device by controlling the current in another active device of a circuit, keeping the output current constant regardless of loading. (search "current mirror" on Wikipedia.com Mar. 6, 2020. Modified. Accessed May 1, 2020.)

The current mirror circuit 902 may be coupled to a word line voltage 920 provided by a driver circuit and may be coupled to the current control circuit 904. The current mirror circuit 902 may mirror the reference current 922 supplied by the current control circuit 904 or the memory current 924 from a set of word lines of the non-volatile memory array 210, as selected, at least in part, by the switching circuit 500. "Reference current" refers to a current configured to serve as a reference in determining whether leakage current meets or exceeds a leakage current threshold. In certain embodiments, a reference current may be set by a manufacturer and may be configured to account for changes in current as current being tested flows through a leakage current testing circuit. "Memory current" refers to an electrical current flowing through memory cells of a non-volatile memory array.

In mirroring these currents, the current mirror circuit 902 may produce an output current 926 reflecting, and/or representative of, the mirrored current. The current mirror circuit 902 may in some embodiments comprise a ripple arrester 908 configured to mitigate voltage spikes from the driver circuit. "Ripple arrester" refers to a circuit, sub-circuit, circuitry, electronic component, hardware, software, firmware, module, logic, device, or apparatus configured, programmed, designed, arranged, or engineered to detect and/or mitigate a fluctuation in voltage from a voltage source such as a driver circuit (e.g., charge pump). In particular, a ripple arrester may mitigate spikes in a source voltage from a charge pump, such as a VPGM voltage supplied for word lines.

The current mirror circuit 902 and resistor 906 connect in series to the SAR ADC circuit 1000. The SAR ADC circuit 1000 generates one of the reference code and the leakage code. "Successive approximation analog to digital conversion circuit" or "SAR ADC circuit" refers to a type of analog-to-digital converter that converts a continuous analog waveform into a discrete digital representation via a binary search through all possible quantization levels before finally converging upon a digital output for each conversion. (Search "Successive approximation ADC" on Wikipedia.com, Mar. 23, 2020. Accessed Mar. 23, 2020.) "Successive approximation" refers to a process of iteratively adjusting a digital output code until the digital output code accurately encodes a signal level of an input signal such as an input voltage.

The resistor 906 is configured such that the resistor 906 transforms one of the reference current 922 and the memory current 924 (depending on which phase/stage of a leakage detection test being performed) to generate a leakage detection voltage. If a reference code is being generated, the resistor 906 transforms a reference current. If a leakage code is being generated, the resistor 906 transforms a memory current 924. The resistor 906 transforms the reference current 922 or memory current 924 by way of the output current 926 from the current mirror circuit 902 into the leakage detection voltage 918.

The leakage detection circuit 600 comprises a source transformer. The source transformer may supply a leakage detection voltage 918 to the SAR ADC circuit 1000 to output a nine-bit digital output code within ten clock cycles. "Source transformer" refers to a circuit, sub-circuit, circuitry, or electronic component configured, programmed, designed, arranged, or engineered to convert an electrical current into a substantially equivalent electrical voltage or to convert an electrical voltage into a substantially equivalent electrical current. Generally, the source transformer is configured to connect to the source voltage or current in either a parallel configuration or a series configuration in order to transform the electrical current or voltage into the corresponding voltage or current. The digital output code may comprise a reference code or a leakage code.

In one embodiment, the source transformer comprises the resistor 906 connected in series to the current mirror circuit 902 and the SAR ADC circuit 1000. "Resistor" refers to a passive two-terminal electrical component that implements electrical resistance as a circuit element. (search "resistor" on Wikipedia.com Mar. 23, 2020. Accessed May 1, 2020.)

The resistor 906 may connect in series between the current mirror circuit 902 and the SAR ADC circuit 1000. The resistor 906 may be configured to transform the output current 926 (mirroring either the reference current 922 or the memory current 924) into a leakage detection voltage 918. In one embodiment, the resistor may be a 200 kΩ resistor.

The SAR ADC circuit 1000 may receive the leakage detection voltage 918 and may generate a digital output code based on the leakage detection voltage 918. The digital output code may comprise a reference code when the leakage detection voltage 918 reflects the reference current 922 or may comprise a leakage code when the leakage detection voltage 918 reflects the memory current 924. The driver circuit previously described may supply the word line voltage 920 to the set of word lines of the non-volatile memory array 210 when the leakage detection circuit 900 determines either the reference code or the leakage code. Operation of the SAR ADC circuit 1000 is described in greater detail with respect to FIG. 10.

Operation

The switching circuit 500 of the memory die may connect to the current mirror circuit 902. The switching circuit 500 may be connectable to the set of word lines of the non-volatile memory array 210 and the memory current 924 in response to a signal from the die controller. The switching circuit 500 may, in some embodiments, also connect to the current control circuit 904 and the reference current 922 in response to a signal from the die controller. The switching circuit 500 together with the current control circuit 904 enables connecting and disconnecting sets set of word lines to the current mirror circuit 902 such that a reference code may be generated and alternately a leakage code may be generated. The switching circuit may have, incur, experience, or comprise, a junction leakage current that contributes to the leakage detection voltage. In certain embodiments, the reference current 922 is configured to account for the junction leakage current, which may exist when a set of word lines are tested to generate a leakage code.

The current control circuit 904 supplies current for detecting leakage current within the word lines of a non-volatile memory array 210. The leakage detection circuit 900 may further comprise a current mirror circuit 902 coupled to the programming voltage from the driver circuit and the current control circuit 904. This current mirror circuit 902 may be configured to mirror one of a reference current 922 supplied by the current control circuit 904 and a memory current 924 from the selected word lines. The leakage detection circuit 900 may comprise a source transformer configured to transform the reference current 922 and memory current 924 into a leakage detection voltage 918. The leakage detection circuit 900 may be configured to output a nine-bit digital output code within ten clock cycles. This digital output code may comprise a reference code or a leakage code. The leakage detection circuit 900 of this embodiment may further comprise a SAR ADC circuit 1000 configured to receive the leakage detection voltage 918 and generate a reference code based on that leakage detection voltage 918 in response to the reference current 922 from the current control circuit 904. The SAR ADC circuit 1000 may also generate a leakage code based on the leakage detection voltage 918 in response to the memory current 924.

During leakage testing, in accordance with one embodiment of this disclosure, the current mirror circuit 902 of the leakage detection circuit 900 may be configured to generate an output current 926 by mirroring the reference current 922 drawn by the current control circuit 904. This reference current 922 may be generated through manipulation of the variable current sources 912 by the reference current controller 910. The reference current controller 910 may set one variable current source to draw a common mode current 914 to support and reflect basic operation of the current mirror circuit 902. The reference current controller 910 may also set one variable current source to draw a detection current 916 based on the acceptable operation of the portions of the non-volatile memory array 210 to be tested (i.e., the sets of word lines forming storage blocks, physical erase blocks, etc.). With these variable current sources 912 set as desired, the current mirror circuit 902 may generate an output current 926 equal to or proportional to the reference current 922.

The output current 926 representing the reference current 922 may, by the presence of the resistor 906 or some other source transformer, be transformed into a reference leakage detection voltage 918. The SAR ADC circuit 1000 may accept this reference leakage detection voltage as input, and may generate a digitalized reference code reflective of the reference leakage detection voltage 918 level. This digitalized reference code generated by the SAR ADC circuit 1000 may be a nine-bit digital output code. The reference code may be stored for further use in, for example, a dedicated register, or in some other accessible location. In some embodiments, a combination of circuitry in the switching circuit 500 and the current control circuit 904 may disconnect the leakage detection circuit 900 from the set of word lines of a storage block of the non-volatile memory array 210 before the reference current 922 is connected to the current mirror circuit 902. In this manner, a reference code may be determined without influence from word lines in a storage block of the non-volatile memory array 210.

With the reference code stored, the switching circuit 500 and/or current control circuit 904 may be configured to connect the current mirror circuit 902 input side to the set of word lines to be tested. The word line voltage 920 may be applied to the set of word lines through the action of the current mirror circuit 902 and the switching circuit 500, which may cause the word lines under test to draw a memory current 924. The current mirror circuit 902 may reflect an output current 926 equal or proportional to this memory current 924.

Through the action of the resistor 906, or other source transformer, the output current 926 reflective of the memory current 924 may be transformed into a leakage detection voltage 918. This leakage detection voltage 918 may be digitalized by the SAR ADC circuit 1000 into a leakage code, similar to the development of the reference code, and as described in greater detail below. This leakage code may be a nine-bit digital output code.

Once a reference code and a leakage code have been determined for a set of word lines under test, these two codes may be compared. This comparison may be made by the die controller in some embodiments. If the leakage code is less than or equal to the reference code, this indicates that the set of word lines under test is drawing current commensurate with normal operation, and no word lines have an unacceptable level of leakage current. If the leakage code exceeds the reference code, this may indicate an unacceptable level of leakage current within the set of word lines. In some embodiments, a predetermined leakage current threshold may be reflected, captured, or represented by the reference code.

When a set of word lines exhibits leakage current in excess of a leakage current threshold, as indicated by examination of the leakage code, the storage block containing those word lines may be deemed a bad storage block and may be marked as unusable by the die controller. This testing may be repeated for multiple sets of word lines within a storage block, and for all storage blocks within a memory die.

Figure 10:
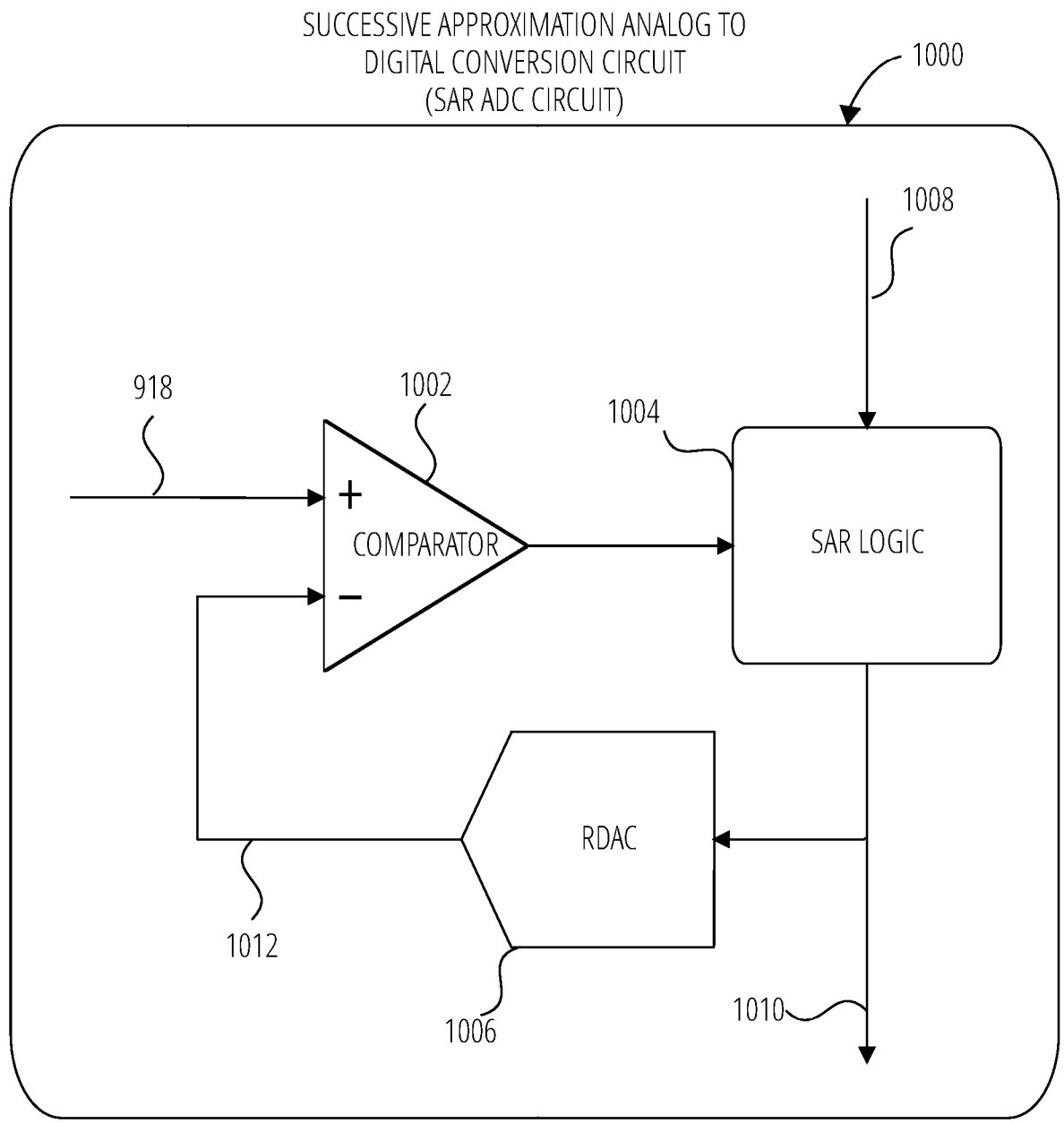
FIG. 10 illustrates a SAR ADC circuit 1000 in accordance with one embodiment.

FIG. 10 illustrates a SAR ADC circuit 1000 in accordance with one embodiment. The SAR ADC circuit 1000 comprises a comparator 1002, a successive approximation logic circuit 1004, and a resistor digital to analog converter circuit 1006. The comparator 1002 takes as one input the leakage detection voltage 918 generated within the leakage detection circuit 900 as described above. The successive approximation logic circuit 1004 takes in the output of the comparator 1002, as well as an input clock 1008. The successive approximation logic circuit 1004 may be configured to output one bit of a digital output code 1010 on each clock cycle of the input clock 1008, starting with a most significant bit (MSB).

This digital output code 1010 may be converted back into analog form by the resistor digital to analog converter circuit 1006. "Resistor digital to analog converter circuit" refers to a circuit, sub-circuit, circuitry, electronic component, hardware, software, firmware, module, logic, device, or apparatus configured, programmed, designed, arranged, or engineered to convert a digital binary code into an analog signal, such as an analog feedback signal. The resistor digital to analog converter circuit 1006 may be configured to convert each successive bit of the digital output code 1010 into an analog feedback signal 1012 and may provide the analog feedback signal 1012 to the comparator 1002.

"Successive bit" refers to a next bit in a binary encoding that progressively evaluates each bit in a binary code in a predefined order. In one embodiment, each bit of a binary encoding is evaluated starting with a most significant bit, then a next most significant bit, in sequence until a least significant bit is evaluated. "Analog feedback signal" refers to an electronic signal output by a resistor digital to analog converter circuit based on a digital output code input. The comparator 1002 may be configured to receive the leakage detection voltage 918 and the analog feedback signal 1012, and to send a signal to the successive approximation logic circuit 1004 in response to the analog feedback signal 1012 exceeding the leakage detection voltage 918. "Successive approximation logic circuit" refers to a circuit, sub-circuit, circuitry, electronic component, hardware, software, firmware, module, logic, device, or apparatus configured, programmed, designed, arranged, or engineered to implement successive approximation.

In one embodiment, the SAR ADC circuit 1000 may detect a change in leakage detection voltage 918 of about 4.6 mV, corresponding to a change in the memory current of about 24 nA-25 nA. The SAR ADC circuit may be configured to determine one bit of a digital output code on each clock cycle and operate at a clock speed such that the SAR ADC circuit converts the leakage detection voltage to a nine-bit digital output code in less than 5 microseconds. In one embodiment, the input clock speed may be 4.2 MHz. "Input clock" refers to any hardware, software, firmware, circuit, circuitry, electronic component, module, logic, device, or apparatus configured, programmed, designed, arranged, or engineered to supply a clock signal as input to a circuit and/or electronic component. Such an embodiment may also reflect additional parameters as indicated in the table below.

| SAR ADC Circuit Specifications | |
|---|---|
| Conversion Time | <5 μs |
| Input Dynamic Range | 2.4 V |
| Least Significant Bit (LSB) Step Size | 4.6 mV |
| Number of Bits | 9 |
| Resolution | 4.6 mV |
| Differential Nonlinearity (DNL) | <0.5 × LSB |
| Integral Nonlinearity (INL) | <0.5 × LSB |
| SAR CLK Frequency | 4.2 MHz |

Figure 11:
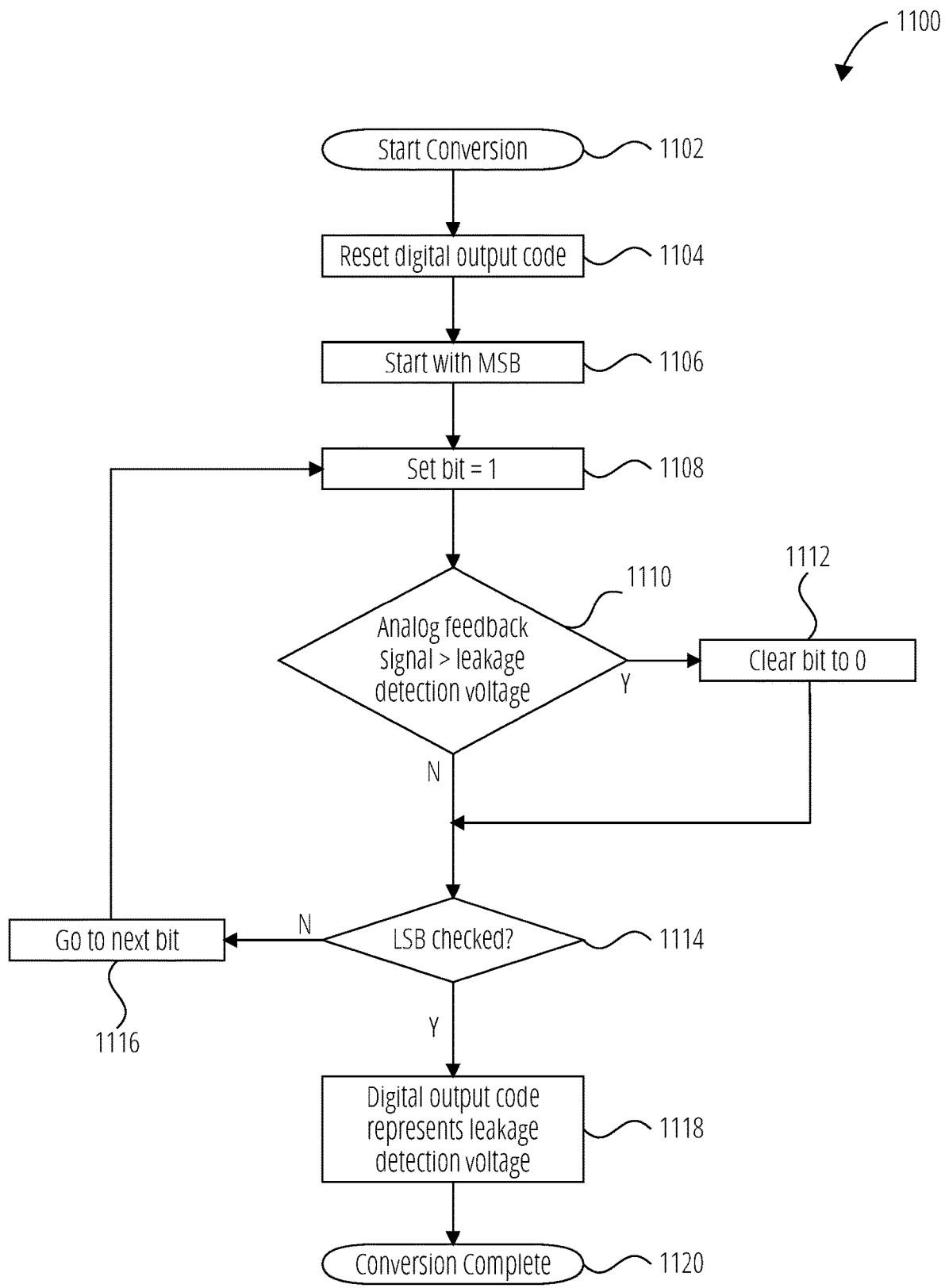
FIG. 11 illustrates a successive approximation logic circuit routine 1100 in accordance with one embodiment.

FIG. 11 illustrates a successive approximation logic circuit routine 1100 in accordance with one embodiment. This successive approximation logic circuit routine 1100 may be performed by the SAR ADC circuit 1000 described above.

At the start 1102 of the routine, the SAR ADC circuit may be enabled. The digital output code may be set to a known base value (for example, "000000000" for a nine-bit digital output code) in step 1104. The first iteration of this routine may begin with the most significant bit (MSB) of the digital output code (step 1106). "Most significant bit" or "MSB" refers to is the bit position in a binary number having the greatest value. The MSB is sometimes referred to as the high-order bit or left-most bit due to the convention in positional notation of writing more significant digits further to the left. (Search "Bit numbering", Wikipedia, Jan. 29, 2019; Accessed May 7, 2020.)

The bit being determined may be set to "1" in step 1108, giving a digital output code of "100000000". The resistor digital to analog converter circuit 1006 (RDAC) may generate an analog output signal representing this "100000000" digital value. The comparator 1002 may compare the analog feedback signal from the RDAC 1006 to the leakage detection voltage 918 (decision step 1110).

If the analog feedback signal 1012 is greater than the leakage detection voltage 918, the SAR ADC circuit may clear the bit being determined back to "0" at step 1112. Otherwise, the bit being determined remains "1". If the least significant bit (LSB) has not yet been determined (i.e., more bits remain to be being determined) at decision step 1114, the next bit will be examined (step 1116) in the next loop iteration by returning to step 1108. "Least significant bit" or "LSB" refers to the bit position in a binary integer giving the units value, that is, determining whether the number is even or odd. The LSB is sometimes referred to as the low-order bit or right-most bit, due to the convention in positional notation of writing less significant digits further to the right. It is analogous to the least significant digit of a decimal integer, which is the digit in the ones (right-most) position. (See "Bit numbering", Wikipedia, Jan. 29, 2019; Accessed May 7, 2020.)

Once the LSB has been determined at decision step 1114, the successive approximation logic circuit routine 1100 continues to step 1118. The digital output code 1010 now represents the leakage detection voltage, and the conversion process is complete (done 1120). Through this successive approximation logic circuit routine 1100, no more than nine clock cycles are needed to accurately generate a nine-bit digital output code for a given input leakage detection voltage 918 (which represents reference current when determining a reference code and leakage current when determining a leakage code).

In one embodiment, the successive approximation logic circuit may be configured to set each successive bit in the digital output code with each clock cycle and reset the successive bit in response to the analog feedback signal exceeding the leakage detection voltage. The reference code and the leakage code may each comprise a nine-bit binary code, wherein the SAR ADC circuit may determine the reference code and the leakage code using successive approximation configured to implement a binary search for a digital output code of the SAR ADC circuit. "Binary search" refers to a method of encoding an analog signal in an electronic circuit such that a digital output code output from an analog to digital converter circuit determines the digital output code using a binary search process of setting successive bits of the digital output code on each clock cycle that the analog to digital converter circuit is enabled. The benefits of this binary search over a linear search performed to determine a similar nine-bit value are described with respect to FIG. 12.

Figure 12:
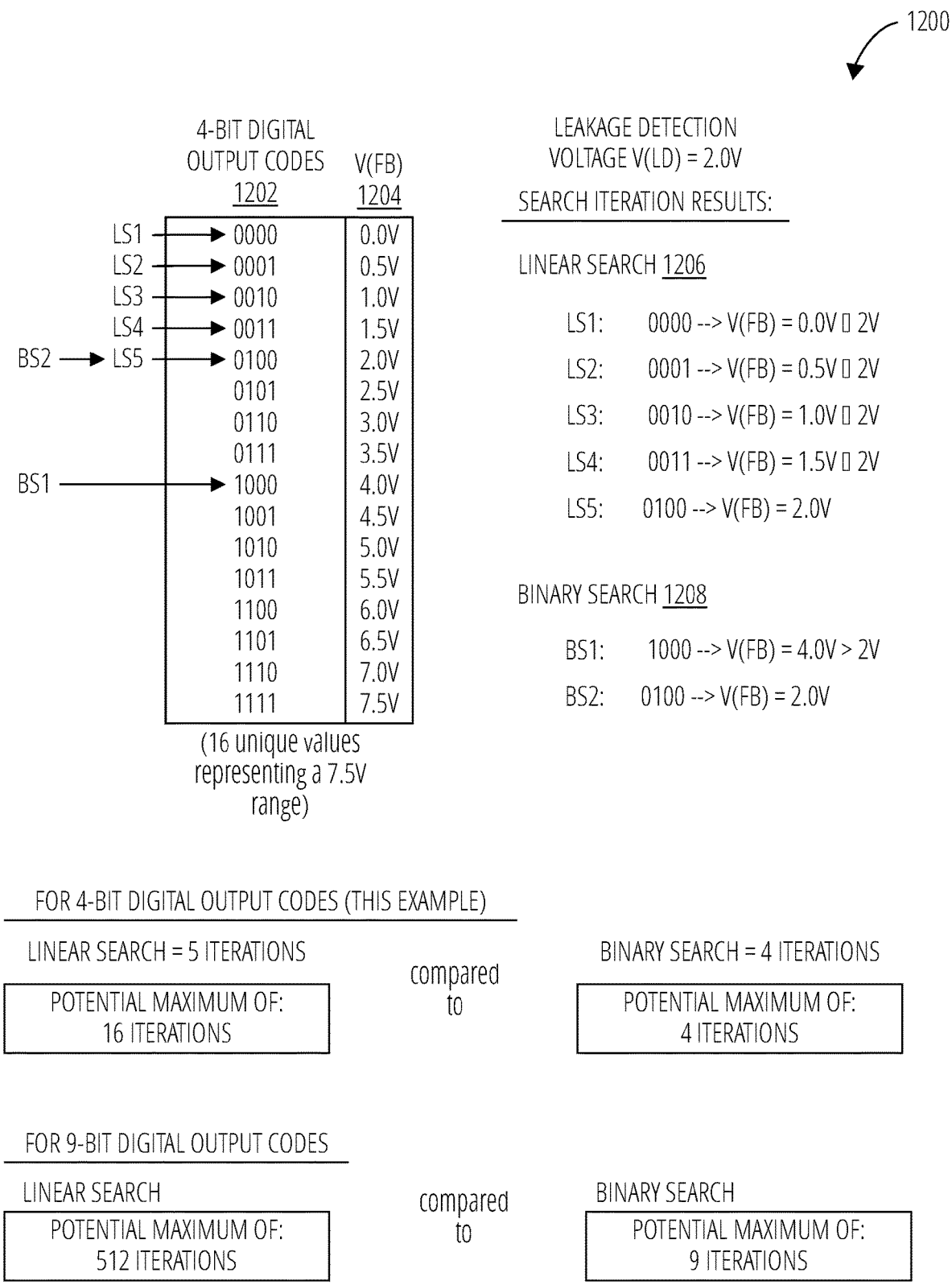
FIG. 12 illustrates a four-bit example of binary search encoding 1200 in accordance with one embodiment.

FIG. 12 illustrates a four-bit example of binary search encoding 1200 in accordance with one embodiment. The smaller, four-bit example is illustrated for simplicity, but one of ordinary skill in the art recognizes how to apply the same concepts for a nine-bit digital output code, and how the benefits of the claimed solution increases as the number of bits increases.

A set of four-bit digital output codes 1202 may be used to represent a range of analog feedback signal voltages 1204. In this illustration, the sixteen unique codes available with four bits are used to represent a voltage range from 0.0V to 7.5V. The testing process illustrated in this example assumes that the leakage detection voltage produced by the leakage detection circuit is 2.0V. This is solely for the purpose of simple illustration and is not intended to limit the disclosed solution in any way. One of skill in the art will recognize that a different voltage range may be more appropriate to the reference, memory, and leakage currents expected. One of skill in the art will also recognize that the number of bits used for the digital output code may improve the accuracy of measurement possible using the disclosed solution(s).

A conventional linear search 1206 algorithm is illustrated. Such a search may begin with the first unique bit combination. For example, the first iteration of such a search (LS1) may examine the first unique code, "0000". In the illustrated example, "0000" represents and will generate a feedback voltage of 0.0V. This is not equal to the leakage detection voltage of 2.0V, and the search continues. Subsequent unique codes ("0001", "0010", etc.) are tested in subsequent iterations (LS2, LS3, etc.). On the fifth iteration (LS5), the code "0100" is examined, and determined to produce a feedback voltage of 2.0V, which is equal to an example leakage detection voltage received as input. Thus, the conventional linear search 1206 algorithm may take five iterations or five clock cycles to produce the desired result.

In contrast, the binary search 1208 algorithm disclosed may examine the unique codes beginning with one for which the most significant bit is "1" and the remaining bits are "0". In this iteration (BS1), the code examined is then "1000", which corresponds to a feedback voltage of 4.0V. As this is greater than the target voltage value, this bit, the MSB, will be reset to "0" for the next iteration. In that next iteration (BS2), the next most significant bit is set to 1, giving a code of "0100" and a feedback voltage of 2.0V. As this feedback voltage matches the leakage detection voltage, the binary search completes. By examining one bit per clock cycle, this binary search 1208 algorithm may take two iterations or two clock cycles to produce the desired result, as compared with the five clock cycles used for the linear search 1206. The binary search 1208 will take the same number of iterations as there are bits in the output code and the approximation may reach the desired result in fewer than all of the iterations.

In a worst case, the linear search 1206 may need to visit every one of the sixteen unique digital output codes, taking sixteen clock cycles to achieve the desired result, for example if the feedback voltage is 7.5V. However, the binary search 1208 examines the digital output codes bit-wise as described, and would thus use just four clock cycles, one for each bit, to determine an appropriate digital output code.

In order to achieve the accuracy imparted by using a nine-bit digital output code, the difference between a linear search 1206 and a binary search 1208 is more pronounced. In a worst case scenario, the linear search 1206 may take up to 512 iterations where the binary search 1208 may still use just one clock cycle per bit, or 9 clock cycles, to determine.

Figure 13:
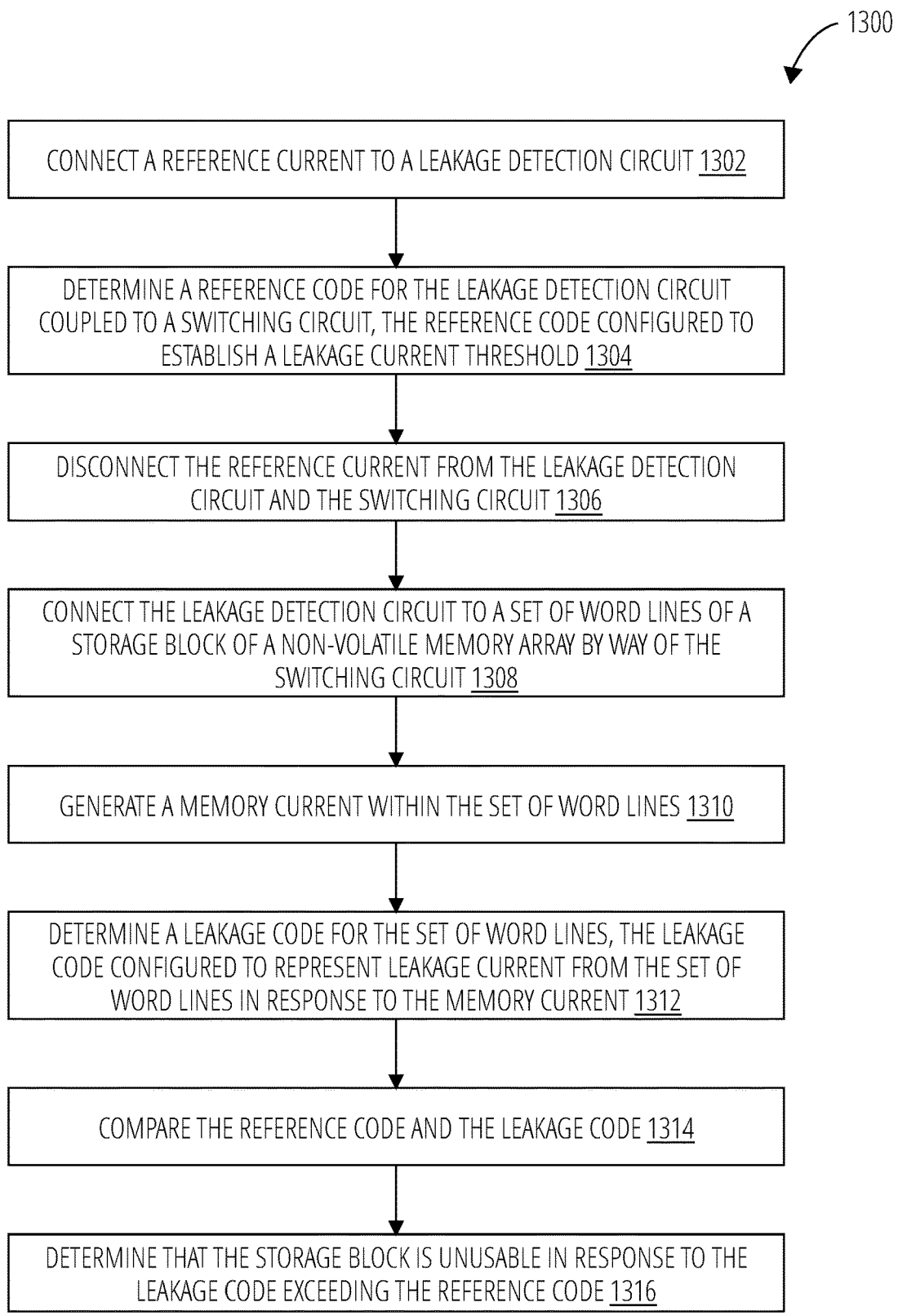
FIG. 13 illustrates a method for detecting leakage current 1300 in accordance with one embodiment.

FIG. 13 illustrates a method for detecting leakage current 1300 for determining memory leakage current in accordance with one embodiment. First, at step 1302, a reference current is connected to a leakage detection circuit. This reference current may be indicative of the expected performance of a memory die under normal operating conditions. This reference current may be generated by a current control circuit such as that introduced in FIG. 9.

In step 1304, a reference code is determined for the leakage detection circuit. This leakage detection circuit may be coupled to a switching circuit. The switching circuit may be as introduced in FIG. 5 and may in turn couple the leakage detection circuit to a non-volatile memory array. The switching circuit may also couple to a current control circuit. The current control circuit may generate a reference current for use in determining the reference code. The reference code may be configured to establish a leakage current threshold.

At step 1306, the reference current may be disconnected from the leakage detection circuit and the switching circuit. Then, in step 1308, the leakage detection circuit may be connected to a set of word lines of a storage block of the non-volatile memory array using the switching circuit. A memory current may be generated within the set of word lines at step 1310.

At step 1312, a leakage code may be generated representing the leakage current from the set of word lines in response to the memory current. This leakage code may at step 1314 be compared with the reference code determined in step 1304. As a result, in step 1316, the die controller may determine that the storage block under test is unusable in response to the leakage code exceeding the reference code.

In some embodiments, the reference code and leakage code may each be a nine-bit binary value. A SAR ADC circuit may be configured to determined one bit of the digital output code on each clock cycle and may operate at a clock speed such that the leakage detection voltage may be converted to a nine-bit output code in less than 5 μs. The SAR ADC circuit may be configured to detect a change in leakage detection voltage of about 4.6 mV and a change in the memory current of about 25 nA. Such a change in the memory current may be due to leakage current.

Figure 14:
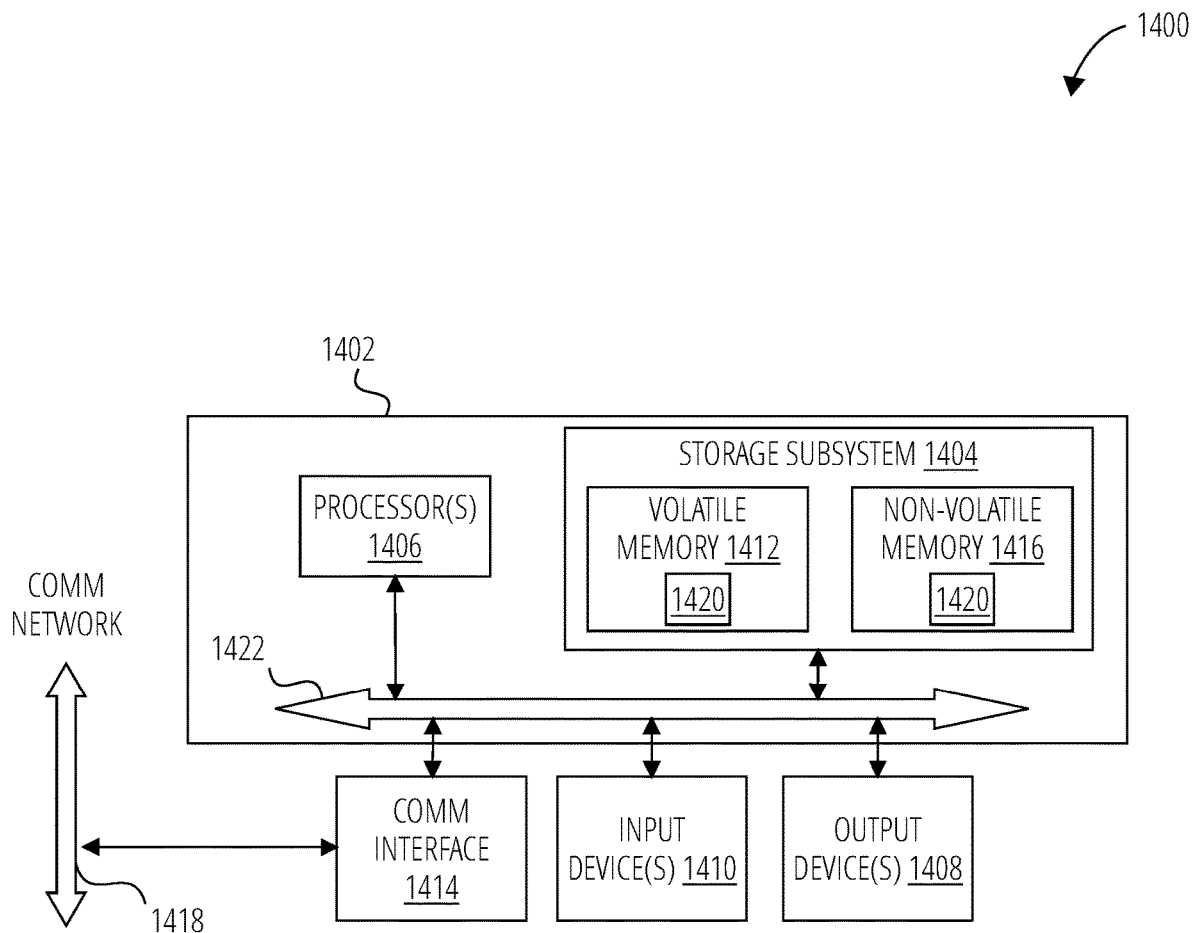
FIG. 14 is an example block diagram of a computing device 1400 that may incorporate certain embodiments.

FIG. 14 is an example block diagram of a computing device 1400 that may incorporate embodiments of the solution. FIG. 14 is merely illustrative of a machine system to carry out aspects of the technical processes described herein and does not limit the scope of the claims. One of ordinary skill in the art would recognize other variations, modifications, and alternatives. In certain embodiments, the computing device 1400 includes a data processing system 1402, a communication network 1418, communication network interface 1414, input device(s) 1410, output device(s) 1408, and the like.

As depicted in FIG. 14, the data processing system 1402 may include one or more processor(s) 1406 and a storage subsystem 1404. "Processor" refers to any circuitry, component, chip, die, package, or module configured to receive, interpret, decode, and execute machine instructions. "Instructions" refers to symbols representing commands for execution by a device using a processor, microprocessor, controller, interpreter, or other programmable logic. Broadly, 'instructions' can mean source code, object code, and executable code. "Instructions" herein is also meant to include commands embodied in programmable read-only memories (EPROM) or hard coded into hardware (e.g., "micro-code") and like implementations wherein the instructions are configured into a machine read-only memory or other hardware component at manufacturing time of a device. Examples of a processor may include, but are not limited to, a central processing unit, a general-purpose processor, an application-specific processor, a graphics processing unit (GPU), a field programmable gate array (FPGA), Application Specific Integrated Circuit (ASIC), System on a Chip (SoC), virtual processor, processor core, and the like.

The processor(s) 1406 communicate with a number of peripheral devices via a bus subsystem 1422. These peripheral devices may include input device(s) 1410, output device(s) 1408, communication network interface 1414, and the storage subsystem 1404. The storage subsystem 1404, in one embodiment, comprises one or more storage devices and/or one or more memory devices.

"Storage device" or "memory device" refers to any hardware, system, sub-system, circuit, component, module, non-volatile memory media, hard disk drive, storage array, device, or apparatus configured, programmed, designed, or engineered to store data for a period of time and retain the data in the storage device while the storage device is not using power from a power supply. Examples of storage devices include, but are not limited to, a hard disk drive, FLASH memory, MRAM memory, a Solid-State storage device, Just a Bunch Of Disks (JBOD), Just a Bunch Of Flash (JBOF), an external hard disk, an internal hard disk, and the like.

"Non-volatile memory media" refers to any hardware, device, component, element, or circuit configured to maintain an alterable physical characteristic used to represent a binary value of zero or one after a primary power source is removed. Examples of the alterable physical characteristic include, but are not limited to, a threshold voltage for a transistor, an electrical resistance level of a memory cell, a current level through a memory cell, a magnetic pole orientation, a spin-transfer torque, and the like.

The alterable physical characteristic is such that, once set, the physical characteristic stays sufficiently fixed such that when a primary power source for the non-volatile memory media is unavailable the alterable physical characteristic can be measured, detected, or sensed, when the binary value is read, retrieved, or sensed. Said another way, non-volatile memory media is a storage media configured such that data stored on the non-volatile memory media is retrievable after a power source for the non-volatile memory media is removed and then restored. Non-volatile memory media may comprise one or more non-volatile memory elements, which may include, but are not limited to: chips, packages, planes, memory die, and the like.

Examples of non-volatile memory media include but are not limited to: ReRAM, Memristor memory, programmable metallization cell memory, phase-change memory (PCM, PCME, PRAM, PCRAM, ovonic unified memory, chalcogenide RAM, or C-RAM), NAND FLASH memory (e.g., 2D NAND FLASH memory, 3D NAND FLASH memory), NOR FLASH memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like.

While the non-volatile memory media is referred to herein as "memory media," in various embodiments, the non-volatile memory media may more generally be referred to as non-volatile memory. Because non-volatile memory media is capable of storing data when a power supply is removed, the non-volatile memory media may also be referred to as a recording media, non-volatile recording media, storage media, storage, non-volatile memory, volatile memory medium, non-volatile storage medium, non-volatile storage, or the like.

In certain embodiments, data stored in non-volatile memory media is addressable at a block level which means that the data in the non-volatile memory media is organized into data blocks that each have a unique logical address (e.g., LBA). In other embodiments, data stored in non-volatile memory media is addressable at a byte level which means that the data in the non-volatile memory media is organized into bytes (8 bits) of data that each have a unique address, such as a logical address. One example of byte addressable non-volatile memory media is storage class memory (SCM).

In one embodiment, the storage subsystem 1404 includes a volatile memory 1412 and a non-volatile memory 1416. The volatile memory 1412 and/or the non-volatile memory 1416 may store computer-executable instructions that alone or together form logic 1420 that when applied to, and executed by, the processor(s) 1406 implement embodiments of the processes disclosed herein.

"Volatile memory" refers to a shorthand name for volatile memory media. In certain embodiments, volatile memory refers to the volatile memory media and the logic, controllers, processor(s), state machine(s), and/or other periphery circuits that manage the volatile memory media and provide access to the volatile memory media.

"Volatile memory media" refers to any hardware, device, component, element, or circuit configured to maintain an alterable physical characteristic used to represent a binary value of zero or one for which the alterable physical characteristic reverts to a default state that no longer represents the binary value when a primary power source is removed or unless a primary power source is used to refresh the represented binary value. Examples of volatile memory media include but are not limited to dynamic random-access memory (DRAM), static random-access memory (SRAM), double data rate random-access memory (DDR RAM) or other random-access solid-state memory.

While the volatile memory media is referred to herein as "memory media," in various embodiments, the volatile memory media may more generally be referred to as volatile memory.

"Non-volatile memory" refers to shorthand name for non-volatile memory media. In certain embodiments, non-volatile memory media refers to the non-volatile memory media and the logic, controllers, processor(s), state machine(s), and/or other periphery circuits that manage the non-volatile memory media and provide access to the non-volatile memory media.

"Circuitry" refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment).

The input device(s) 1410 include devices and mechanisms for inputting information to the data processing system 1402. These may include a keyboard, a keypad, a touch screen incorporated into a graphical user interface, audio input devices such as voice recognition systems, microphones, and other types of input devices. In various embodiments, the input device(s) 1410 may be embodied as a computer mouse, a trackball, a track pad, a joystick, wireless remote, drawing tablet, voice command system, eye tracking system, and the like. The input device(s) 1410 typically allow a user to select objects, icons, control areas, text and the like that appear on a graphical user interface via a command such as a click of a button or the like.

The output device(s) 1408 include devices and mechanisms for outputting information from the data processing system 1402. These may include a graphical user interface, speakers, printers, infrared LEDs, and so on, as well understood in the art. In certain embodiments, a graphical user interface is coupled to the bus subsystem 1422 directly by way of a wired connection. In other embodiments, the graphical user interface couples to the data processing system 1402 by way of the communication network interface 1414. For example, the graphical user interface may comprise a command line interface on a separate computing device 1400 such as desktop, server, or mobile device.

The communication network interface 1414 provides an interface to communication networks (e.g., communication network 1418) and devices external to the data processing system 1402. The communication network interface 1414 may serve as an interface for receiving data from and transmitting data to other systems. Embodiments of the communication network interface 1414 may include an Ethernet interface, a modem (telephone, satellite, cable, ISDN), (asynchronous) digital subscriber line (DSL), Fire-Wire, USB, a wireless communication interface such as Bluetooth or WiFi, a near field communication wireless interface, a cellular interface, and the like.

The communication network interface 1414 may be coupled to the communication network 1418 via an antenna, a cable, or the like. In some embodiments, the communication network interface 1414 may be physically integrated on a circuit board of the data processing system 1402, or in some cases may be implemented in software or firmware, such as "soft modems", or the like.

The computing device 1400 may include logic that enables communications over a network using protocols such as HTTP, TCP/IP, RTP/RTSP, IPX, UDP and the like.

The volatile memory 1412 and the non-volatile memory 1416 are examples of tangible media configured to store computer readable data and instructions to implement various embodiments of the processes described herein. Other types of tangible media include removable memory (e.g., pluggable USB memory devices, mobile device SIM cards), optical storage media such as CD-ROMS, DVDs, semiconductor memories such as flash memories, non-transitory read-only-memories (ROMS), battery-backed volatile memories, networked storage devices, and the like. The volatile memory 1412 and the non-volatile memory 1416 may be configured to store the basic programming and data constructs that provide the functionality of the disclosed processes and other embodiments thereof that fall within the scope of the present disclosure.

Logic 1420 that implements one or more parts of embodiments of the solution may be stored in the volatile memory 1412 and/or the non-volatile memory 1416. Logic 1420 may be read from the volatile memory 1412 and/or non-volatile memory 1416 and executed by the processor(s) 1406. The volatile memory 1412 and the non-volatile memory 1416 may also provide a repository for storing data used by the logic 1420.

The volatile memory 1412 and the non-volatile memory 1416 may include a number of memories including a main random access memory (RAM) for storage of instructions and data during program execution and a read only memory (ROM) in which read-only non-transitory instructions are stored. The volatile memory 1412 and the non-volatile memory 1416 may include a file storage subsystem providing persistent (non-volatile) storage for program and data files. The volatile memory 1412 and the non-volatile memory 1416 may include removable storage systems, such as removable FLASH memory.

The bus subsystem 1422 provides a mechanism for enabling the various components and subsystems of data processing system 1402 communicate with each other as intended. Although the communication network interface 1414 is depicted schematically as a single bus, some embodiments of the bus subsystem 1422 may utilize multiple distinct busses.

It will be readily apparent to one of ordinary skill in the art that the computing device 1400 may be a device such as a smartphone, a desktop computer, a laptop computer, a rack-mounted computer system, a computer server, or a tablet computer device. As commonly known in the art, the computing device 1400 may be implemented as a collection of multiple networked computing devices. Further, the computing device 1400 will typically include operating system logic (not illustrated) the types and nature of which are well known in the art.

Terms used herein should be accorded their ordinary meaning in the relevant arts, or the meaning indicated by their use in context, but if an express definition is provided, that meaning controls.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc., are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

What is claimed is:

1. A method comprising:
generating a reference current in a leakage detection circuit;
connecting the reference current to a current mirror circuit in the leakage detection circuit to generate a first mirrored current;
generating a first leakage detection voltage from the first mirrored current;
determining a digital reference code based on the first leakage detection voltage, the digital reference code configured to establish a leakage current threshold;
disconnecting the reference current from the current mirror circuit;
connecting the leakage detection circuit to a set of word lines of a storage block of a non-volatile memory array;
generating a memory current within the set of word lines;
connecting the memory current to the current mirror circuit to generate a second mirrored current;
generating a second leakage detection voltage from the second mirrored current;
determining a digital leakage code based on the second leakage detection voltage, the digital leakage code configured to represent leakage current from the set of word lines;
comparing the digital reference code and the digital leakage code; and
determining that the storage block is unusable in response to the digital leakage code exceeding the digital reference code.

2. The method of claim 1, wherein the leakage detection circuit comprises:
a resistor configured such that the resistor transforms one of the reference current and the memory current to generate the first leakage detection voltage and the second leakage detection voltage, respectively; and
a successive approximation analog to digital conversion circuit (SAR ADC circuit) configured to receive the first leakage detection voltage and the second leakage detection voltage and generate one of the digital reference code and the digital leakage code based on the first leakage detection voltage and the second leakage detection voltage, respectively; and
wherein the resistor is connected in series between a current mirror circuit and the SAR ADC circuit.

3. The method of claim 2, wherein the SAR ADC circuit comprises:
successive approximation logic circuit configured to output one bit of a digital output code on each clock cycle of an input clock connected to the successive approximation logic circuit starting with a most significant bit (MSB);
a resistor digital to analog converter circuit (RDAC) configured to convert each successive bit of the digital output code into an analog feedback signal; and
a comparator coupled to the successive approximation logic circuit, the comparator configured to receive the first leakage detection voltage and the analog feedback signal and send a signal to the successive approximation logic circuit in response to the analog feedback signal exceeding the first leakage detection voltage.

4. The method of claim 3, wherein the successive approximation logic circuit is configured to set each successive bit in the digital output code with each clock cycle and reset the successive bit in response to the analog feedback signal exceeding the first leakage detection voltage.

5. The method of claim 2, wherein the SAR ADC circuit is configured to determine one bit of a digital output code on each clock cycle and operate at a clock speed such that the SAR ADC circuit converts the second leakage detection voltage to a 9-bit digital output code in less than 5 microseconds.

6. The method of claim 2, wherein the SAR ADC circuit is configured to detect a change in the second leakage detection voltage of about 4.6 millivolts and a change in the memory current of about 25 nano amps.

7. The method of claim 2, wherein the digital reference code and the digital leakage code each comprise a 9-bit binary code and wherein the SAR ADC circuit determines the digital reference code and the digital leakage code using successive approximation configured to implement a binary search for a digital output code of the SAR ADC circuit.

8. The method of claim 1, further comprising selectively connecting the reference current and the memory current of the current mirror circuit using a switching circuit, wherein the switching circuit incurs a junction leakage current that varies based on process, voltage and temperature (PVT) and the leakage detection circuit is configured to account for junction leakage current.

9. The method of claim 1, further comprising supplying a reference voltage to the leakage detection circuit when determining the digital reference code and to the set of word lines when determining the digital leakage code.

10. The method of claim 1, further comprising disconnecting the leakage detection circuit from the set of word lines of a storage block of a non-volatile memory array prior to connecting the reference current.

11. An apparatus, comprising:
a driver circuit configured to supply a word line voltage to a set of word lines of a non-volatile memory array to detect leakage current from the set of word lines;
a leakage detection circuit comprising:
a current control circuit configured to supply current for detecting the leakage current within the set of word lines;
a current mirror circuit coupled to the word line voltage from the driver circuit and coupled to the current control circuit, the current mirror circuit configured to mirror one of a reference current supplied by the current control circuit and a memory current from the set of word lines;
a resistor configured such that the resistor transforms one of the reference current and the memory current into a leakage detection voltage; and
a successive approximation analog to digital conversion circuit (SAR ADC circuit) configured to receive the leakage detection voltage and generate a digital output code based on the leakage detection voltage, the digital output code comprising one of a reference code and a leakage code, the SAR ADC circuit connected in series to the resistor and to the current mirror circuit; and
a die controller configured to:
direct the leakage detection circuit to determine a reference code that comprises a leakage current threshold;
direct the leakage detection circuit to determine a leakage code that comprises a leakage current from the set of word lines;
compare the reference code and the leakage code; and
determine that the set of word lines have unacceptable leakage current in response to the leakage code exceeding the reference code.

12. The apparatus of claim 11, comprising a plurality of storage blocks of a plane of a memory die and wherein the die controller is configured to iteratively test even selected word lines and odd selected word lines within each storage block to detect leakage current within a set of word lines of the storage block, the set of word lines comprising one of the even selected word lines and the odd selected word lines.

13. The apparatus of claim 11, comprising a switching circuit connected to the current mirror circuit and connectable to the set of word lines and the memory current in response to a signal from the die controller, the switching circuit also connectable to the current control circuit and the reference current in response to the signal from the die controller, the switching circuit having a junction leakage current that contributes to the leakage detection voltage.

14. The apparatus of claim 11, wherein the reference code and the leakage code each comprise a 9-bit binary code wherein the SAR ADC circuit determines the reference code and the leakage code using successive approximation configured to implement a binary search for the digital output code of the SAR ADC circuit.

15. The apparatus of claim 11, wherein the driver circuit supplies the word line voltage to the leakage detection circuit when the leakage detection circuit determines the reference code and to the set of word lines when the leakage detection circuit determines the leakage code.

16. The apparatus of claim 11, wherein the resistor is a 200 kilo-ohm resistor and wherein the SAR ADC circuit is configured to detect a change in leakage detection voltage of about 4.6 millivolts and a change in the memory current of about 25 nano amps.

17. The apparatus of claim 11, wherein the SAR ADC circuit is configured to determine one bit of a digital output code on each clock cycle and operate at a clock speed such that the SAR ADC circuit converts the leakage detection voltage to a 9-bit digital output code in less than 5 microseconds.

18. The apparatus of claim 11, wherein the current mirror circuit comprises a ripple arrester configured to mitigate voltage spikes from the driver circuit and the current control circuit comprises a variable current source configured to supply a common mode current for maintaining the current mirror circuit.

19. An apparatus, comprising:
   a non-volatile memory array comprising two planes, each plane organized into a plurality of physical erase blocks, each physical erase block comprising word lines having memory cells coupled to NAND strings coupled to bit lines;
   a driver circuit configured to supply a word line programming voltage to selected word lines within each of the plurality of physical erase blocks;
   a leakage detection circuit comprising:
      a current control circuit configured to supply current for detecting leakage current within the word lines;
      a current mirror circuit coupled to the programming voltage from the driver circuit and coupled to the current control circuit, the current mirror circuit configured to mirror one of a reference current supplied by the current control circuit and a memory current from the selected word lines; and
      a source transformer configured to transform one of the reference current and the memory current into a leakage detection voltage;
   wherein the leakage detection circuit is configured to output a 9-bit digital output code within nine clock cycles, the digital output code comprising one of a reference code and a leakage code; and
   a die controller configured to:
      direct the leakage detection circuit to determine a reference code that comprises a leakage current threshold;
      direct the leakage detection circuit to determine an even leakage code that comprises a leakage current from even selected word lines;
      compare the reference code and even leakage code;
      determine that the even selected word lines have unacceptable leakage current in response to the even leakage code exceeding the reference code;
      direct the leakage detection circuit to determine an odd leakage code that comprises a leakage current from odd selected word lines;
      compare the reference code and odd leakage code; and
      determine that the odd selected word lines have unacceptable leakage current in response to the odd leakage code exceeding the reference code.

20. The apparatus of claim 19, wherein the leakage detection circuit comprises a successive approximation analog to digital conversion circuit (SAR ADC circuit) configured to receive the leakage detection voltage and generate a reference code based on the leakage detection voltage in response to the reference current from the current control circuit and to generate a leakage code based on the leakage detection voltage in response to a memory current.

* * * * *